United States Patent
Uemori et al.

(10) Patent No.: US 8,779,951 B2
(45) Date of Patent: Jul. 15, 2014

(54) MULTI-BIT DELTA-SIGMA TIME DIGITIZER CIRCUIT AND CALIBRATION METHOD THEREOF

(71) Applicant: Semiconductor Technology Academic Research Center, Yokohama (JP)

(72) Inventors: Satoshi Uemori, Kiryu (JP); Masamichi Ishii, Kiryu (JP); Haruo Kobayashi, Kiryu (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 0 days.

(21) Appl. No.: 13/767,078

(22) Filed: Feb. 14, 2013

(65) Prior Publication Data
US 2013/0214945 A1     Aug. 22, 2013

(30) Foreign Application Priority Data

Feb. 16, 2012  (JP) ................................ 2012-031484
Dec. 3, 2012   (JP) ................................ 2012-264178

(51) Int. Cl.
*G04F 10/00*   (2006.01)
*G01R 25/00*   (2006.01)
*H03K 5/26*    (2006.01)

(52) U.S. Cl.
CPC .............. *G04F 10/005* (2013.01); *G01R 25/00* (2013.01); *H03K 5/26* (2013.01)
USPC ................. 341/111; 327/155; 702/79; 702/89

(58) Field of Classification Search
CPC ............................... G04F 10/005; G01R 25/04
USPC ................................................ 341/111, 166
See application file for complete search history.

(56) References Cited

U.S. PATENT DOCUMENTS

| | | | | |
|---|---|---|---|---|
| 6,163,759 | A * | 12/2000 | Kita ................................ | 702/85 |
| 6,754,613 | B2 * | 6/2004 | Tabatabaei et al. ........... | 702/189 |
| 8,471,736 | B1 * | 6/2013 | Booth et al. .................. | 341/115 |
| 2009/0267668 | A1 * | 10/2009 | Lin ................................ | 327/161 |
| 2009/0322574 | A1 * | 12/2009 | Rivoir ........................... | 341/166 |

FOREIGN PATENT DOCUMENTS

| | | |
|---|---|---|
| JP | 05-068128 U | 9/1993 |
| JP | 5-259907 A  | 10/1993 |
| JP | 6-051027 A  | 2/1994 |

(Continued)

OTHER PUBLICATIONS

Ito et al., Stochastic TDC Architecture with Self-Calibration, Dec. 2010, IEEE, 2010 IEEE Asia Pacific Conference on Circuits and Systems (APCCAS), pp. 1027-1030.*

(Continued)

*Primary Examiner* — Howard Williams
(74) *Attorney, Agent, or Firm* — Oblon, Spivak, McClelland, Maier & Neustadt, L.L.P.

(57) ABSTRACT

According to one embodiment, a multi-bit delta-sigma time digitizer circuit includes a delay array including delay selection circuits respectively including a delay element and a multiplexer, a phase comparator calculating a time difference, an integrator integrating the time difference output, a flash A/D converter executing digital conversion, a ring oscillation circuit including the delay array, a counter measuring a number of clock signal pulses, a memory storing a delay value of the delay element, and a processor correcting an output result of the A/D converter based on the delay value when the rising timing interval is measured.

5 Claims, 30 Drawing Sheets

(56) References Cited

FOREIGN PATENT DOCUMENTS

| JP | 2001-264397 A | 9/2001 |
|---|---|---|
| JP | 2002-076860 A | 3/2002 |
| JP | 2007-509583 A | 4/2007 |
| JP | 2008-294782 A | 12/2008 |
| JP | 2011-519529 A | 7/2011 |
| WO | 2008/012915 A1 | 1/2008 |

OTHER PUBLICATIONS

Straayer et al., A Multi-Path Gated Ring Oscillator TDC With First-Order Noise Shaping, IEEE Journal of Solid-State Circuits, vol. 44, No. 4, Apr. 2009, pp. 1089-1098.*

Dong-Woo Jee, et al., "A 2 GHz Fractional-N Digital PLL with 1b Noise Shaping $\Delta\Sigma$ TDC", Symposium on VLSI Circuits Digest of Technical Papers, Jun. 2011, pp. 116-117.

Brian Young, et al., "A 2.4ps Resolution 2.1mW Second-Order Noise-Shaped Time-To-Digital Converter with 3.2ns Range in 1MHz Bandwidth", IEEE Custom Integrated Circuits, Sep. 2010, 4 pages.

Ying Cao, et al., "A 1.7mW 11b 1-1-1 Mash $\Delta\Sigma$ Time-to-Digital Converter", IEEE International Solid-State Circuits Conference, Session 27, Feb. 23, 2011, pp. 480-482.

John G. Kauffman, et al., "An 8mW 50MS/s CT $\Delta\Sigma$ Modulator with 81dB SFDR and Digital Background DAC Linearization", IEEE International Solid-State Circuits Conference, Digest of Technical Papers, Session 27, Feb. 23, 2011, pp. 472-474.

Office Action mailed Feb. 4, 2014, in Japanese Patent Application No. 2012-264178 filed Dec. 3, 2013 (with English-language translation).

Uemori, etc., "Study of Sigma-Delta-type Time Digitizer Circuit," Reference Materials for Technical Conference of Institute of Electrical Engineers of Japan. ECT, Electronic Circuit Technical Conference 2011 (67), pp. 55-59, Oct. 20, 2011, ECT-11-077. http://www.el.gunma-u.ac.jp/-kobaweb/news/pdf/2011/uemori-nagasaki20110927pm2.pdf.

Satoshi Uemori (and 6 others), Study on Circuit Structure of Digital Signal Time Difference Measurement (Test at System Level), 66th FTC Technical Conference, Japan, Jan. 20, 2012, URL, http://www.el.gunma-u-ac.jp/-kobaweb/news/pdf/2011/2012-01-19uemori.pdf.

* cited by examiner

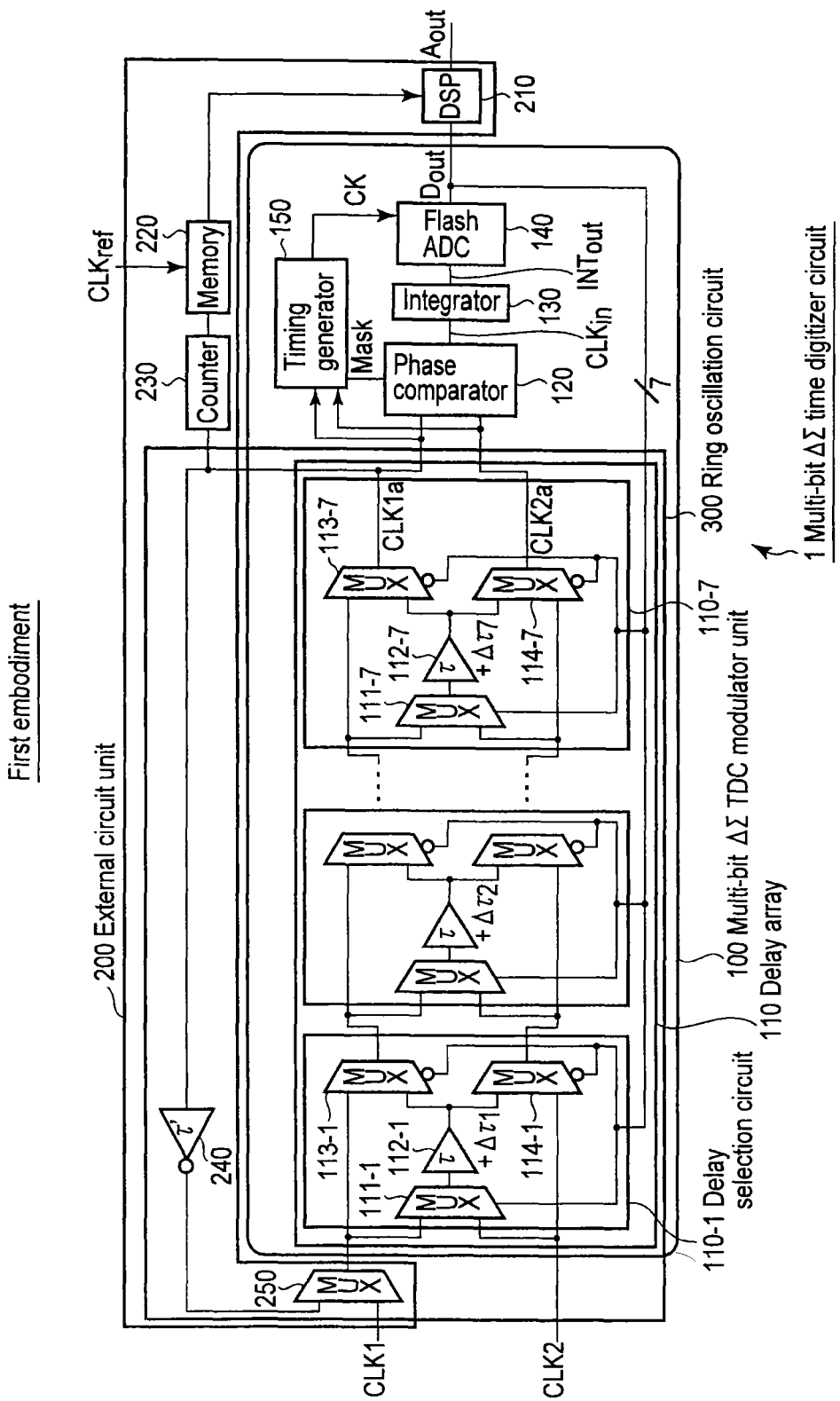
F I G. 1

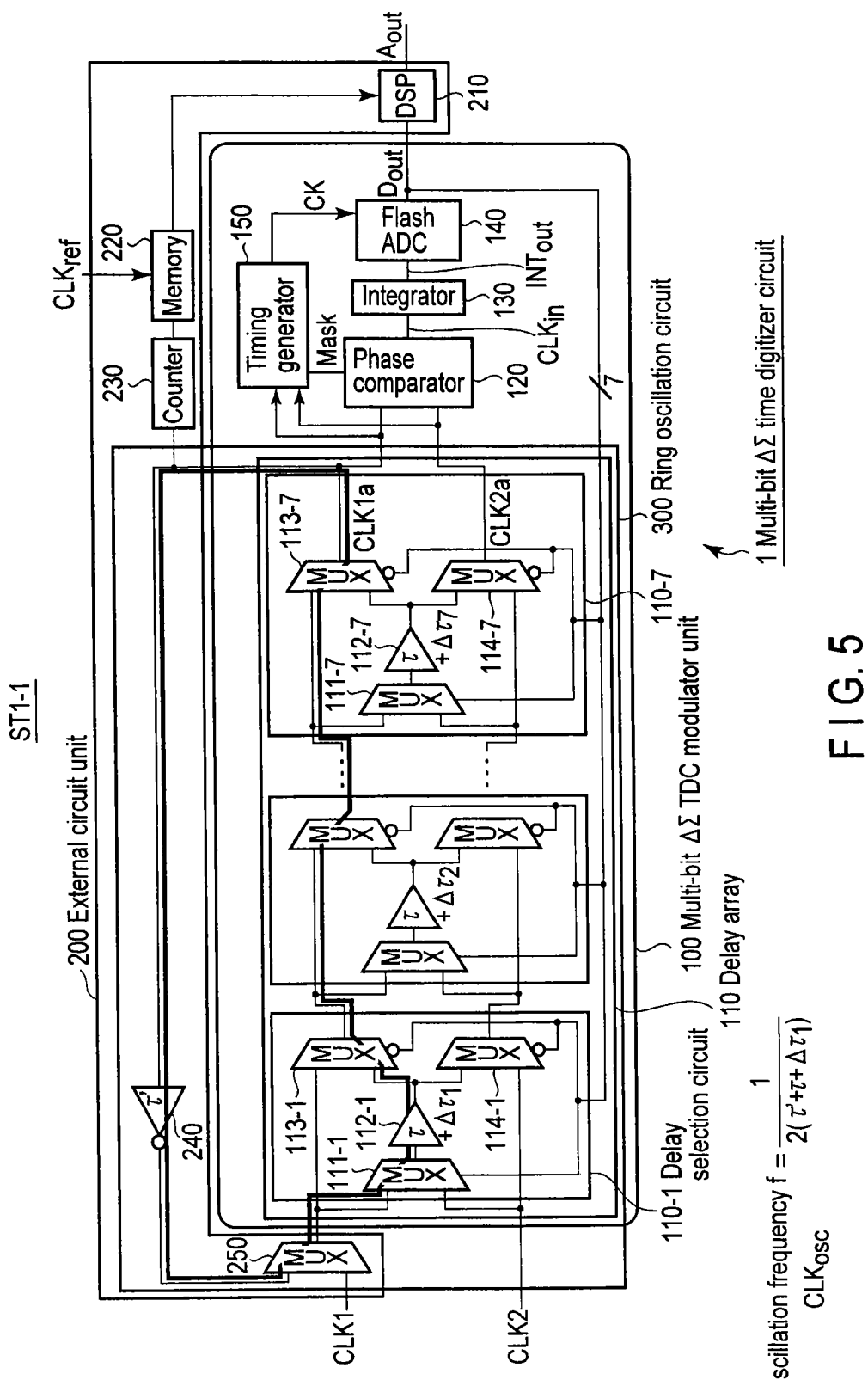
F I G. 5

| | Delay parameter for simulation | | | | | | | |
|---|---|---|---|---|---|---|---|---|
| | Condition 1 | | | | | | | |
| | τ1 | τ2 | τ3 | τ4 | τ5 | τ6 | τ7 [ns] | τ Total [ns] |
| Ideal delay value | 0.145 | 0.145 | 0.145 | 0.145 | 0.145 | 0.145 | 0.145 | 1.015 |
| Delay value | 0.140 | 0.149 | 0.148 | 0.143 | 0.145 | 0.148 | 0.146 | 1.019 |
| | Condition 2 | | | | | | | |
| | τ1 | τ2 | τ3 | τ4 | τ5 | τ6 | τ7 [ns] | τ Total [ns] |
| Ideal delay value | 0.145 | 0.145 | 0.145 | 0.145 | 0.145 | 0.145 | 0.145 | 1.015 |
| Delay value | 0.149 | 0.152 | 0.138 | 0.145 | 0.144 | 0.135 | 0.147 | 1.010 |

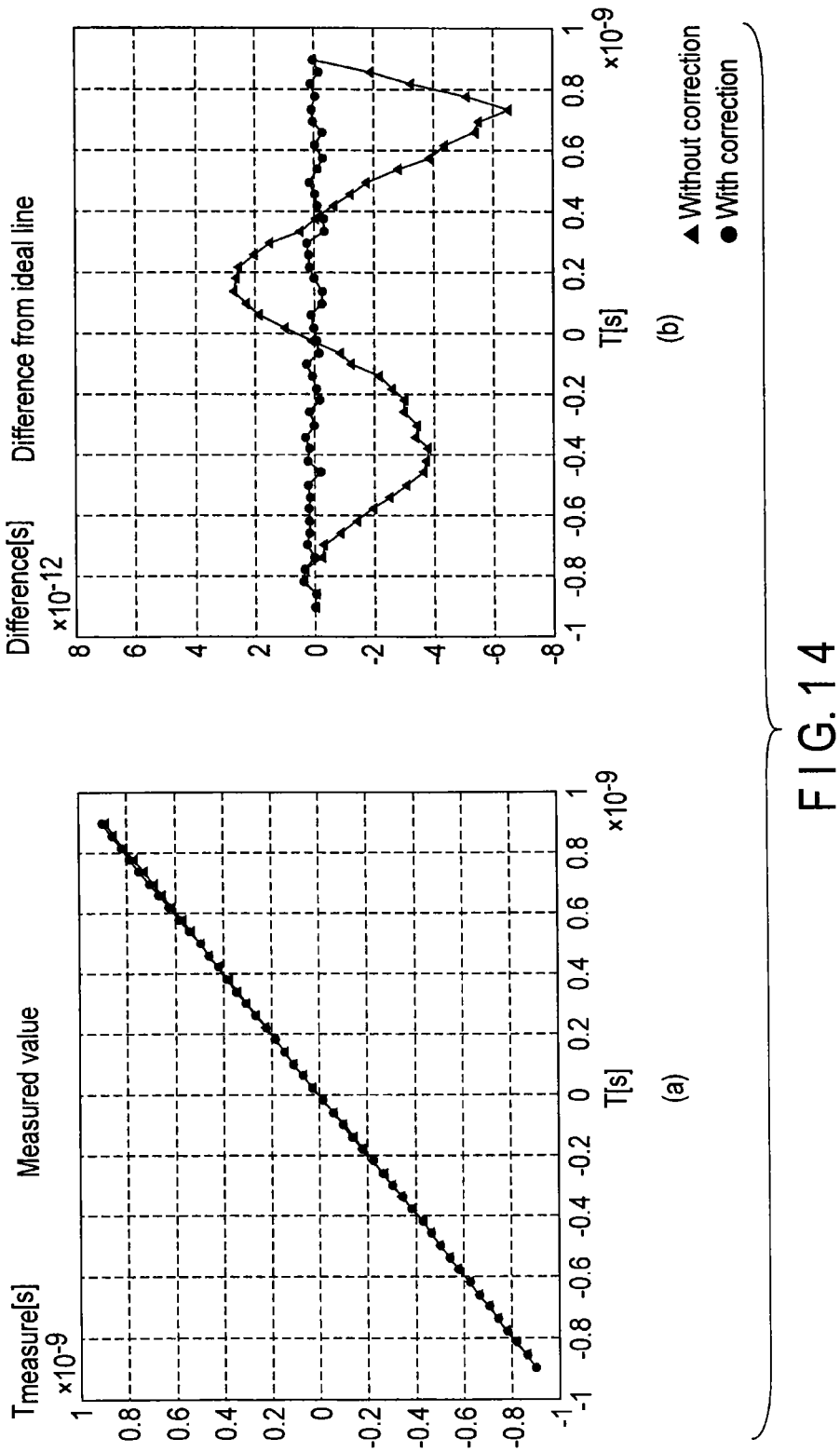
F I G. 14

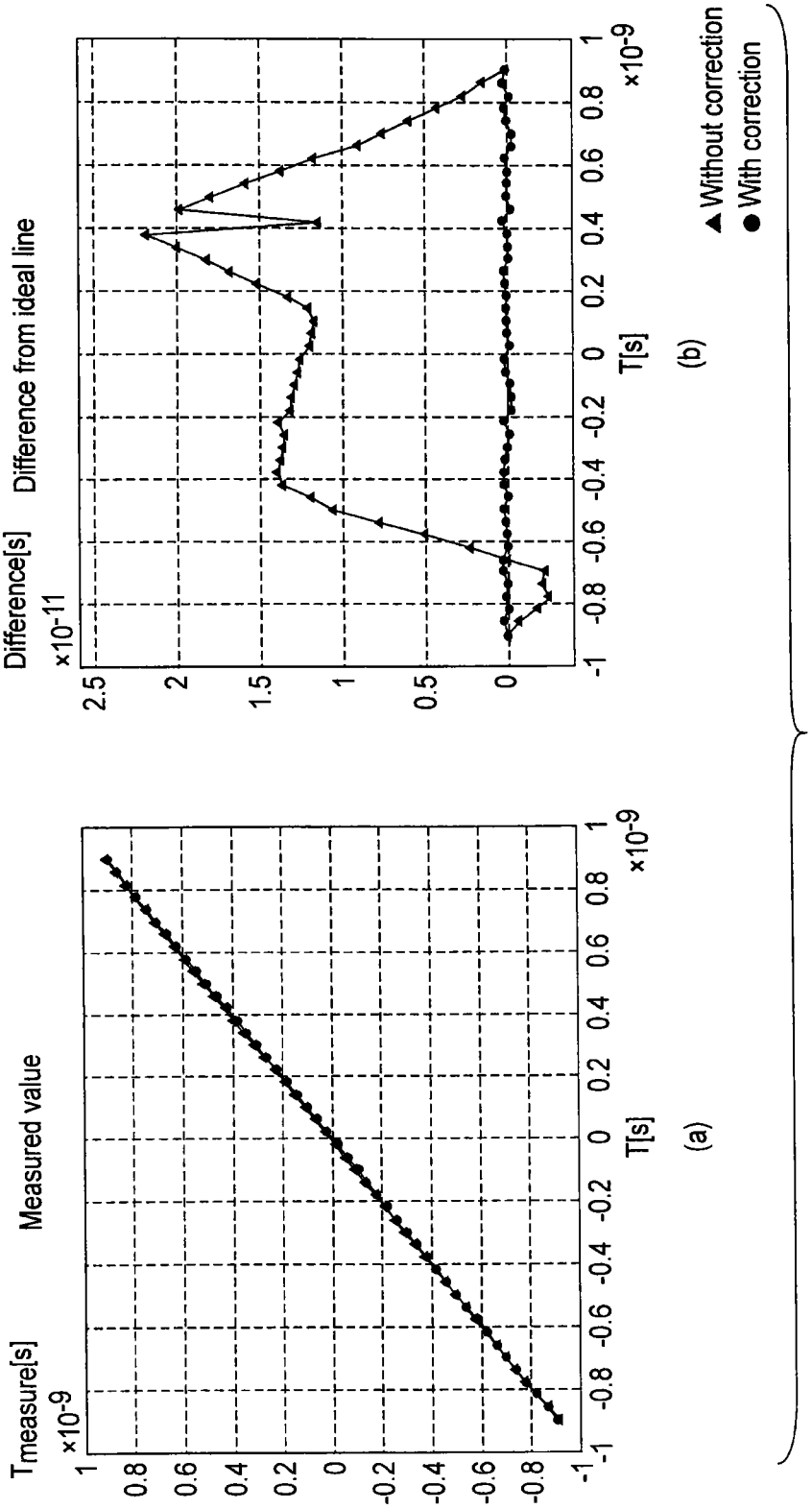
F I G. 16

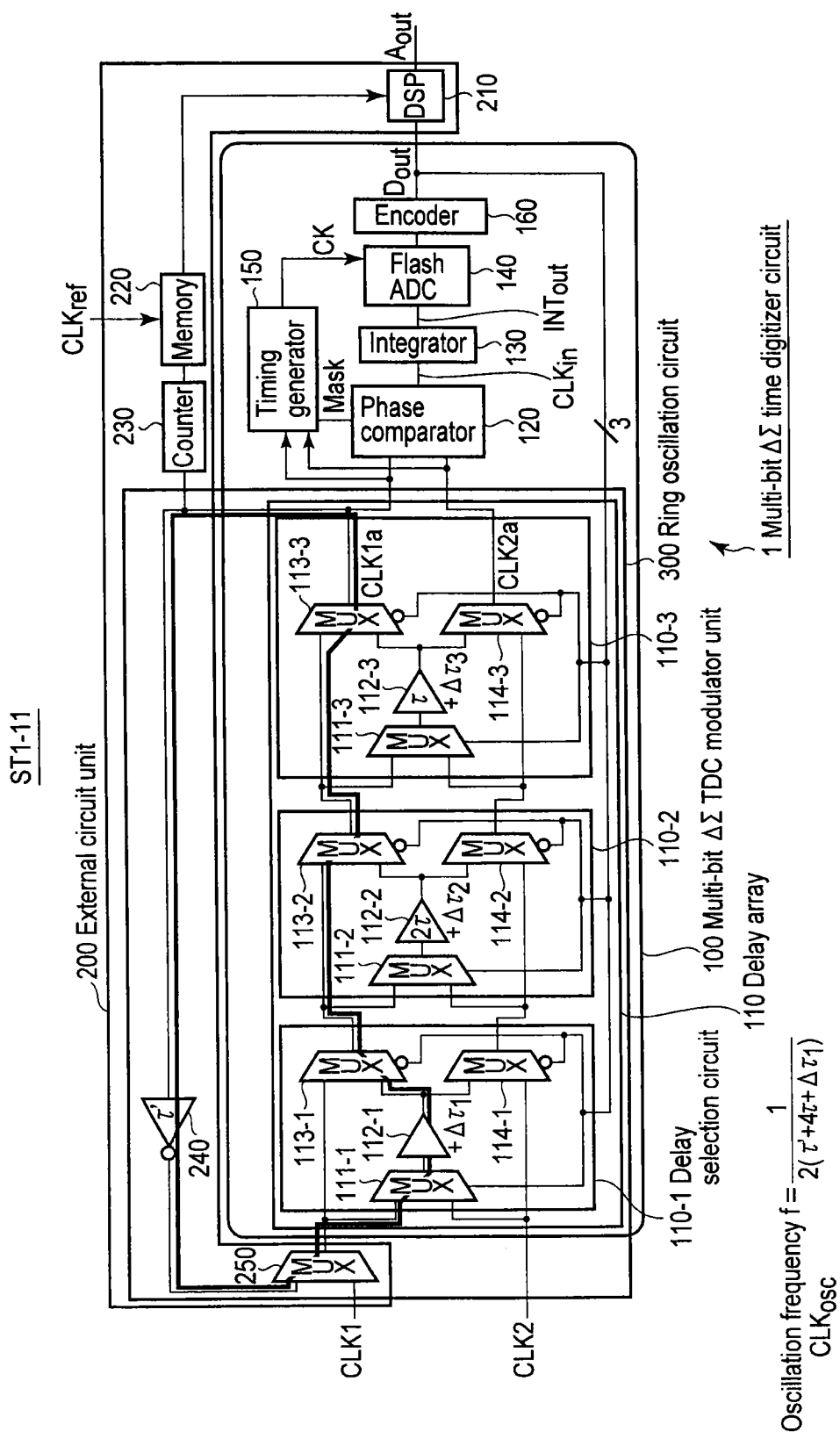
F I G. 19

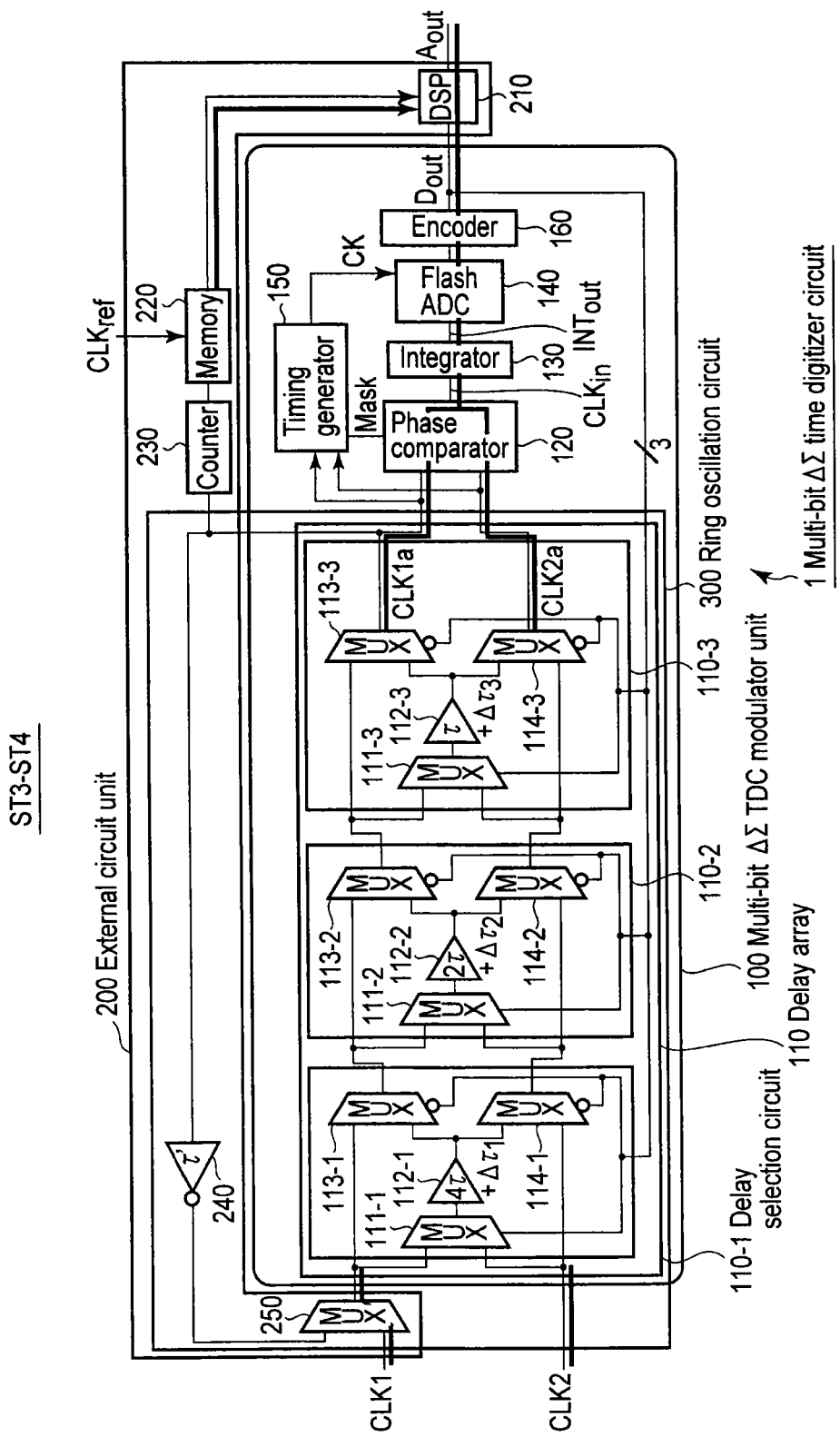
F I G. 22

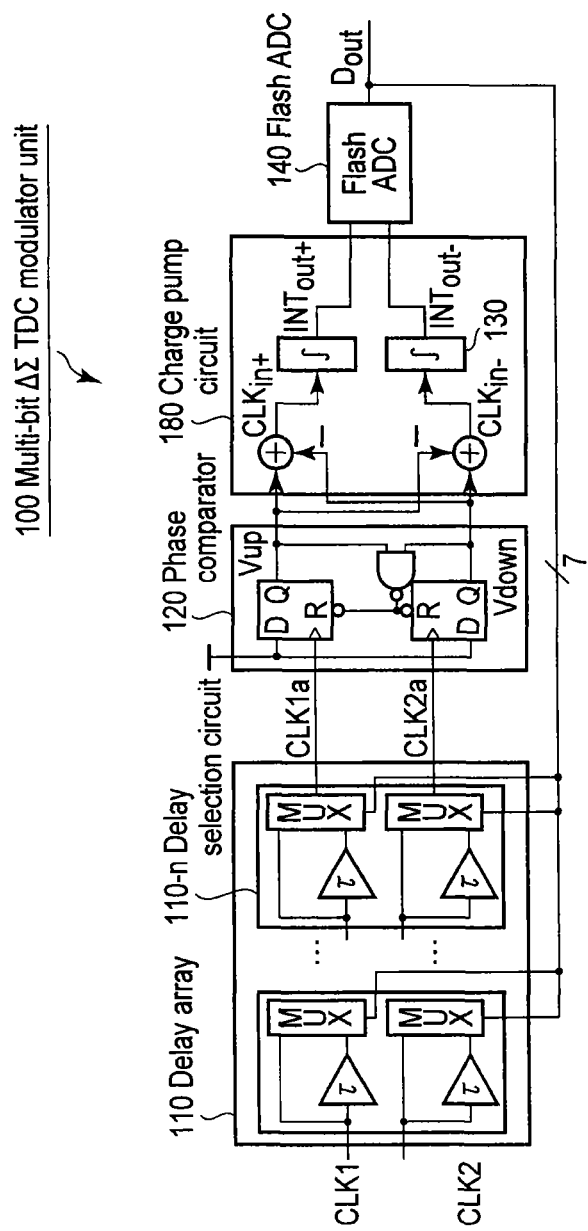
F I G. 26

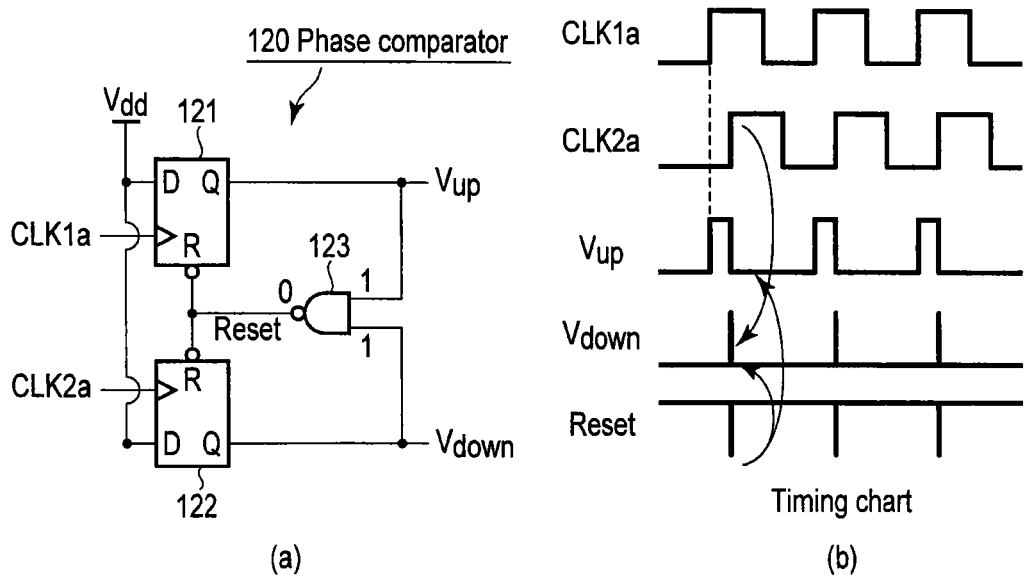
F I G. 29
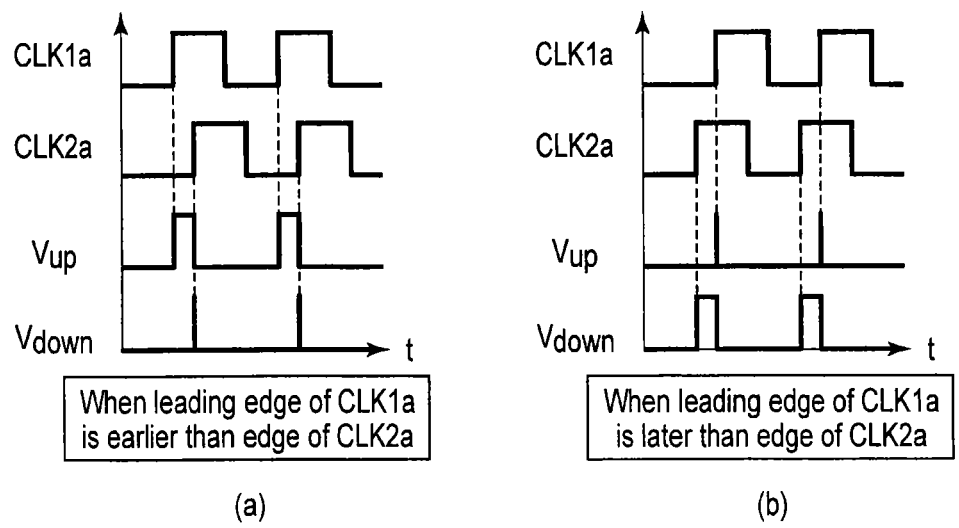
F I G. 30

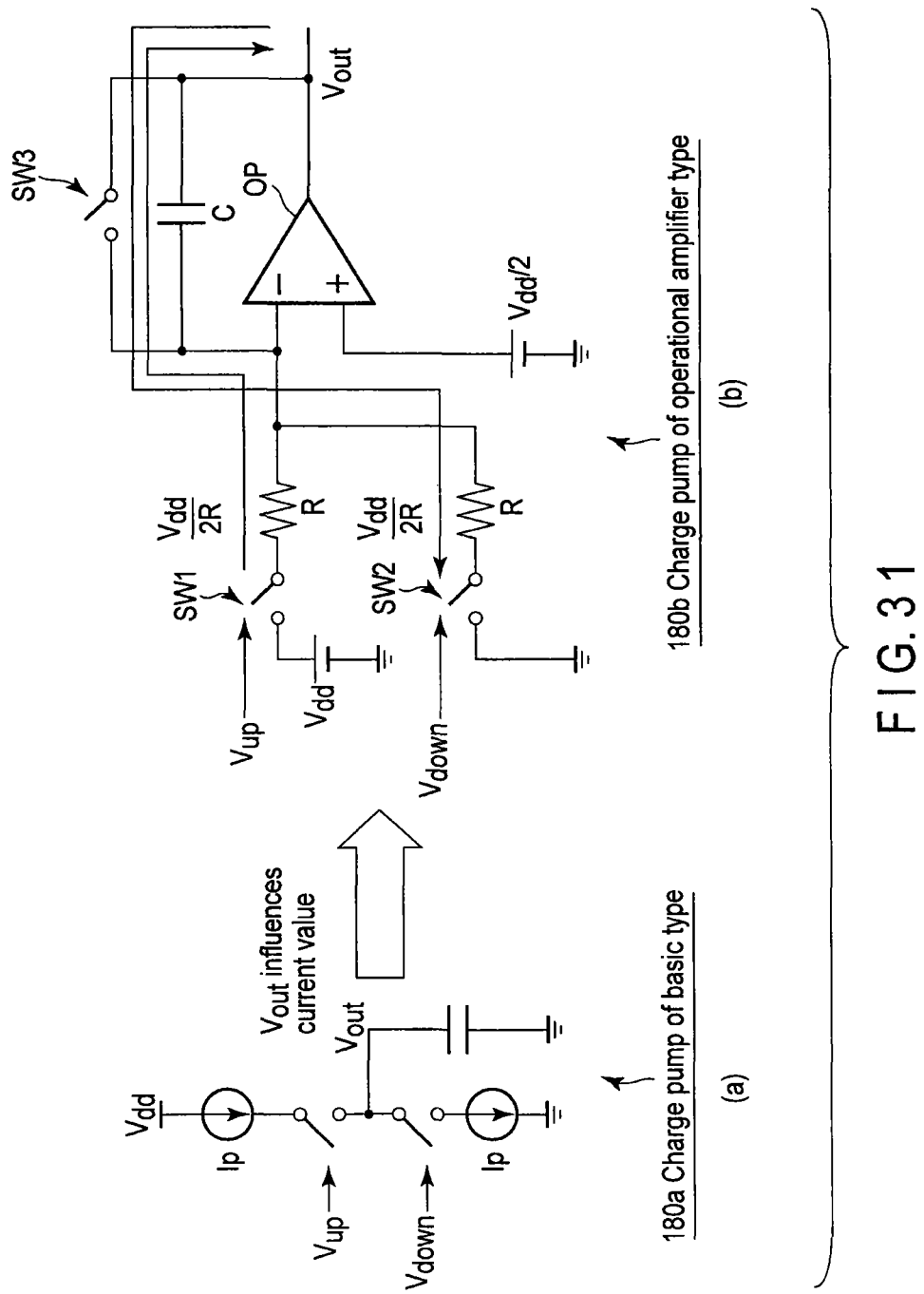
F I G. 31

MULTI-BIT DELTA-SIGMA TIME DIGITIZER CIRCUIT AND CALIBRATION METHOD THEREOF

CROSS-REFERENCE TO RELATED APPLICATIONS

This application is based upon and claims the benefit of priority from Japanese Patent Applications No. 2012-031484, filed Feb. 16, 2012; and No. 2012-264178, filed Dec. 3, 2012, the entire contents of all of which are incorporated herein by reference.

FIELD

Embodiments described herein relate generally to a multi-bit delta-sigma ($\Delta\Sigma$) time digitizer circuit, which can improve linearity of an output, and a calibration method thereof.

BACKGROUND

In recent years, a $\Delta\Sigma$ TDC (Time-to-Digital Converter) which is required to measure a time difference between two repetitive clocks with high time resolution and by a simple circuit has been proposed. By configuring this $\Delta\Sigma$ TDC as a multi-bit circuit, finer measurement can be attained for an identical measurement time compared to a 1-bit circuit.

However, in the multi-bit circuit, since the number of delay elements increases, delay values of a plurality of delay elements may vary relatively. When such delay mismatch has occurred, if an output calculation is made intact, an output result becomes nonlinear, thus causing a measurement error.

Also, a method of making error correction by estimating error components of an internal DAC of a $\Delta\Sigma$ ADC in a digital manner has been reported. With this method, correction is attained by subtracting estimated error components at the output timing. However, this error correction method is not used in the TDC.

BRIEF DESCRIPTION OF THE DRAWINGS

FIG. 1 is a block diagram showing the circuit arrangement of a multi-bit $\Delta\Sigma$ time digitizer circuit according to the first embodiment;

FIG. 5 is a block diagram for explaining the measurement operation of a delay value in step ST1-1 shown in FIG. 3 according to the first embodiment;

FIG. 14 includes graphs showing simulation results (condition 1, the number of outputs: 599 points) of the multi-bit $\Delta\Sigma$ time digitizer circuit according to the first embodiment;

FIG. 16 includes graphs showing simulation results (condition 2, the number of outputs: 599 points) of the multi-bit $\Delta\Sigma$ time digitizer circuit according to the first embodiment;

FIG. 19 is a block diagram for explaining a measurement method of a delay value in step ST1-11 shown in FIG. 18 according to the second embodiment;

FIG. 22 is a block diagram for explaining a method of reading out and correcting delay data in steps ST3 and ST4 shown in FIG. 2 according to the second embodiment;

FIG. 26 is a circuit diagram showing the arrangement of a multi-bit $\Delta\Sigma$ TDC modulator unit according to respective embodiments;

FIG. 29 shows the circuit arrangement and timing chart of a phase comparator according to respective embodiments;

FIG. 30 includes timing charts of the phase comparator according to respective embodiments;

FIG. 31 includes circuit diagrams showing the arrangement of a charge pump circuit according to respective embodiments;

DETAILED DESCRIPTION

Figure 2:
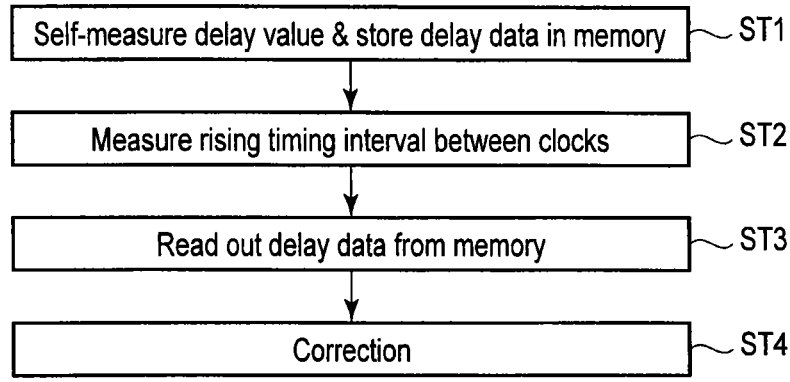
FIG. 2 is a flowchart showing an overview of a self-calibration method of the multi-bit $\Delta\Sigma$ time digitizer circuit according to the first embodiment.

In general, according to one embodiment, a delta-sigma time digitizer circuit is a multi-bit delta-sigma time digitizer circuit, which measures a rising timing interval between a first clock signal and a second clock signal, the circuit comprising: a delay array which includes a plurality of delay selection circuits respectively having a delay element and a multiplexer, and is configured to delay one of the first clock signal and the second clock signal; a phase comparator configured to calculate a time difference according to an output signal of the delay array; an integrator configured to integrate the time difference output from the phase comparator; a flash A/D converter configured to execute digital conversion according to an integration result of the integrator; a ring oscillation circuit configured to include the delay array; a counter configured to measure a number of pulses of a clock signal which passes through the ring oscillation circuit; a memory configured to store a delay value of the delay element calculated from an oscillation frequency based on the number of pulses; and a processor configured to correct an output result of the A/D converter based on the delay value stored in the memory when the rising timing intervals between the first clock signal and the second clock signal input to the delay array is measured.

[1] Overview

In a multi-bit delta-sigma ($\Delta\Sigma$) time digitizer circuit of the embodiment, before the beginning of measurement of a time difference between repetitive clocks, actual delay values of respective delay elements are self-measured, and an output is self-calibrated (corrected) based on the actual delay values at the measurement timing of the time difference between repetitive clocks.

In the self-measurement of the respective delay values according to the embodiment, multiplexers are controlled to connect delay elements one by one to configure a ring oscillation circuit, and an actual delay value is calculated by calculating an oscillation frequency based on the number of pulses measured by a counter.

In the output correction according to the embodiment, a method similar to an error correction method of a DAC in a $\Delta\Sigma$ ADC is used, and is applied to a multi-bit $\Delta\Sigma$ TDC. In a calculation of outputs measured by the $\Delta\Sigma$ TDC, if a comparator output is 1, an output is added as $\tau$; if it is 0, an output is added as $-\tau$, and an average value of the sum is a measurement value. At the time of this calculation, self-calibration is executed using the self-measured actual delay values.

Conventionally, when a multi-bit $\Delta\Sigma$ TDC is used, a measurement time can be shortened compared to a 1-bit circuit, but a problem of a nonlinear output is posed due to errors of delay elements. However, according to the embodiment, by outputting a measurement value in consideration of delay values including errors, linearity can be improved, and measurement errors caused by delay errors can be suppressed.

Embodiments of the present invention will be described hereinafter with reference to the drawings. In the following description, common reference numerals denote common parts throughout the figures.

[2] First Embodiment

[2-1] Circuit

The circuit arrangement of a multi-bit $\Delta\Sigma$ time digitizer circuit according to the first embodiment will be described below with reference to FIG. 1. The multi-bit $\Delta\Sigma$ time digitizer circuit of this embodiment inputs two clock signals CLK1 and CLK2, and measures a rising timing interval (time difference) T between them. Note that this embodiment will exemplify a 3-bit circuit, but the number of bits can be variously changed.

As shown in FIG. 1, a multi-bit $\Delta\Sigma$ time digitizer circuit 1 according to the first embodiment includes a multi-bit $\Delta\Sigma$ time TDC modulator unit 100 and external circuit unit 200.

The multi-bit $\Delta\Sigma$ time TDC modulator unit 100 includes a delay array 110, phase comparator 120, integrator 130, flash ADC (Analog-to-Digital Converter) 140, and timing generator 150. The delay array 110 includes a plurality of delay selection circuits 110-$n$ (in this example, n=1 to 7). Each delay selection circuit 110-$n$ includes a delay element 112-$n$ (in this example, n=1 to 7), and multiplexers (MUX) (selectors) 111-$n$, 113-$n$, and 114-$n$ (in this example, n=1 to 7).

The external circuit unit 200 includes a DSP (Digital Signal Processor) 210, memory (storage unit) 220, counter 230, inverter 240, and multiplexer 250. The DSP 210 may be a processor of another type, for example, a CPU (Central Processing Unit).

In the $\Delta\Sigma$ time digitizer circuit 1 of this embodiment, the delay array 110, inverter 240, and multiplexer (MUX) 250 configure a ring oscillation circuit 300.

In such multi-bit $\Delta\Sigma$ time digitizer circuit 1, an overview of the time difference measurement between the repetitive clock signals CLK1 and CLK2 is as follows. One of the clock signals CLK1 and CLK2 is delayed by the delay array 110 according to an output result $D_{out}$ of the flash ADC 140. Output signals CLK1$a$ and CLK2$a$ of the delay array 110 are input to the phase comparator 120. The phase comparator 120 logically ANDs a Mask signal (faster one of the signals CLK1$a$ and CLK2$a$) and the respective clock signals CLK1$a$ and CLK2$a$, and calculates a time difference CLK$_{in}$ between signals CLK1$b$ and CLK2$b$ as AND results. The integrator 130 integrates the time difference CLK$_{in}$ in a voltage mode, and outputs a value INT$_{out}$. The flash ADC 140 outputs a digital value $D_{out}$ according to the value INT$_{out}$. In this case, the operation of the flash ADC 140 is controlled by a clock CK. Next, the DSP 210 corrects $D_{out}$ based on actual delay values, which are measured using the ring oscillation circuit 300 and are stored in the memory 220, and outputs A$_{out}$.

In this case, in the measurement of delay values using the ring oscillation circuit 300, the delay elements 112-$n$ in the delay array 110 are connected one by one under the control of the multiplexers 111-$n$, 113-$n$, 114-$n$, and 250, and an oscillation frequency is calculated based on the number of pulses measured by the counter 230, thus calculating an actual delay value. This delay value is stored in the memory 220. When the delay value is measured using the ring oscillation circuit 300, the multiplexers 111-*n*, 113-*n*, 114-*n*, and 250 are controlled by the DSP 210 (or CPU).

Note that the multi-bit ΔΣ time digitizer circuit 1 according to this embodiment requires ($2^N-1$) delay selection circuits 110 (delay elements 112) to configure the N-bit ΔΣ time TDC modulator unit 100.

[2-2] Self-Calibration Method

An overview of a self-calibration method of the multi-bit ΔΣ time digitizer circuit according to the first embodiment will be described below with reference to FIG. 2.

Initially, delay values $\tau+\Delta\tau_N$ of the respective delay elements 112-*n* are self-measured using the ring oscillation circuit 300, and delay data are stored in the memory 220 (step ST1). Next, the clock signals CLK1 and CLK2 are input to the ΔΣ time TDC modulator unit 100 which measures a rising timing interval between the signals CLK1 and CLK2 (step ST2). The delay data are read out from the memory 220 according to this measurement result (step ST3), and the DSP 210 corrects an output signal (step ST4).

[2-2-1] Step ST1

An overview of step ST1 in FIG. 2 will be described below with reference to FIGS. 3 and 4. Note that a case of 3 bits will be exemplified below.

Figure 3:
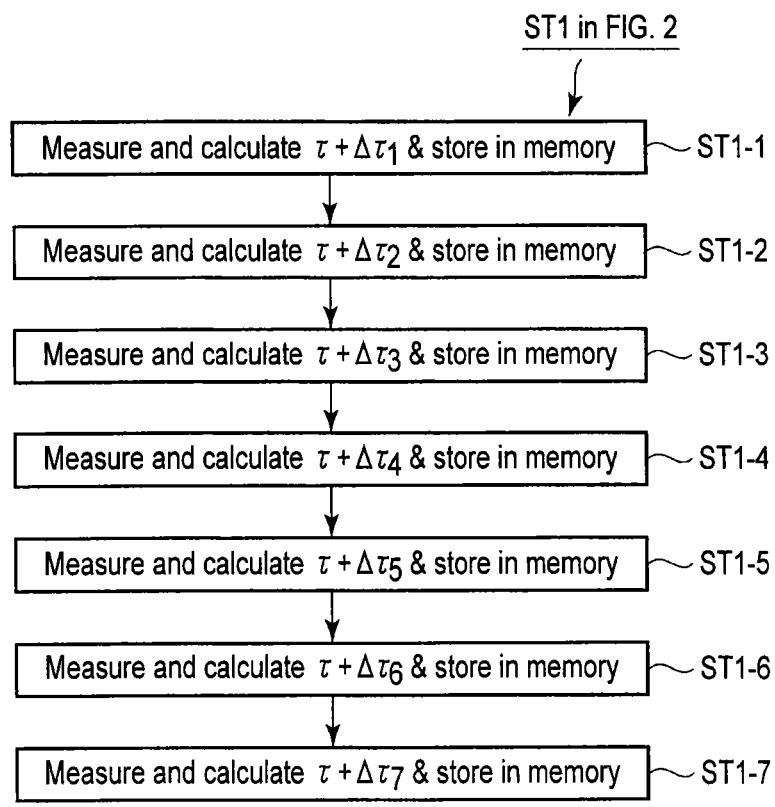
FIG. 3 is a flowchart showing a method of measuring and calculating delay values and storing the delay values in a memory in step ST1 shown in FIG. 2 according to the first embodiment.

As shown in FIG. 3, in step ST1 shown in FIG. 2, a step of measuring and calculating a delay value $\tau+\Delta\tau_N$ of the delay element 112-*n*, and storing the result in the memory 220 is repeated by the number n of delay elements 112-*n*.

Figure 4:
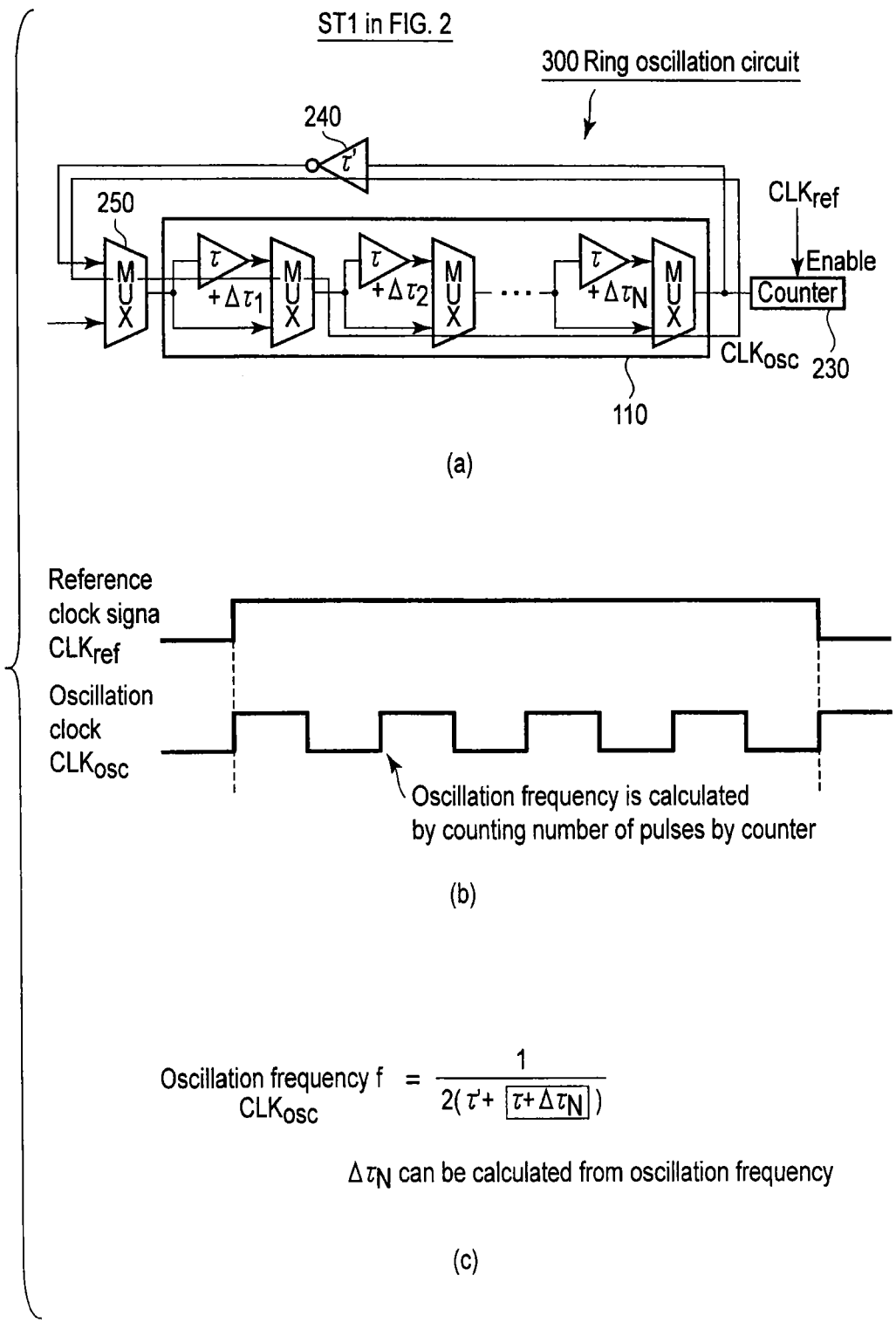
FIG. 4 includes views for explaining a measurement method of a delay value in step ST1 shown in FIG. 2 according to the first embodiment.

As shown in (a) of FIG. 4, the delay value $\tau+\Delta\tau_N$ of the delay element 112-*n* is self-measured using the ring oscillation circuit 300. In this case, as shown in (b) of FIG. 4, the number of pulses of an oscillation clock signal $CLK_{osc}$ of the ring oscillation circuit 300 is counted by the counter 230 using a reference clock signal $CLK_{ref}$, thus calculating an oscillation frequency f. This oscillation frequency f of the oscillation clock $CLK_{osc}$ is given by:

$$f = \frac{1}{2(\tau' + \tau + \Delta\tau_N)} \quad \text{equation (1)}$$

where $\tau'$ is a delay value of the inverter 240. $\tau+\Delta\tau_N$ is a delay value (including an error $\Delta\tau_N$) of the delay element 112-*n*.

Then, as shown in (c) of FIG. 4, the error $\Delta\tau_N$ of the delay value is calculated from the oscillation frequency f using this equation (1).

Step ST1 in FIG. 2 will be described below with reference to FIGS. 5 and 6 taking, as an example, a case of the seven delay elements 112-1 to 112-7 according to this embodiment.

Initially, as shown in FIG. 5, a first delay value delay value $\tau+\Delta\tau_1$ of the first delay element 112-1 is measured and calculated, and the result is stored in the memory 220 (step ST1-1 in FIG. 3). More specifically, using the ring oscillation circuit 300, the number of pulses of the oscillation clock signal $CLK_{osc}$ which passes through the first delay element 112-1 of the first delay selection circuit 110-1 is measured by the counter 230, thus calculating the oscillation frequency f. Then, using equation (1), the first delay value $\tau+\Delta\tau_1$ of the delay element 112-1 is calculated from the oscillation frequency f of the clock signal $CLK_{osc}$. The first delay value $\tau+\Delta\tau_1$ as the calculation result is stored in the memory 220.

Figure 6:
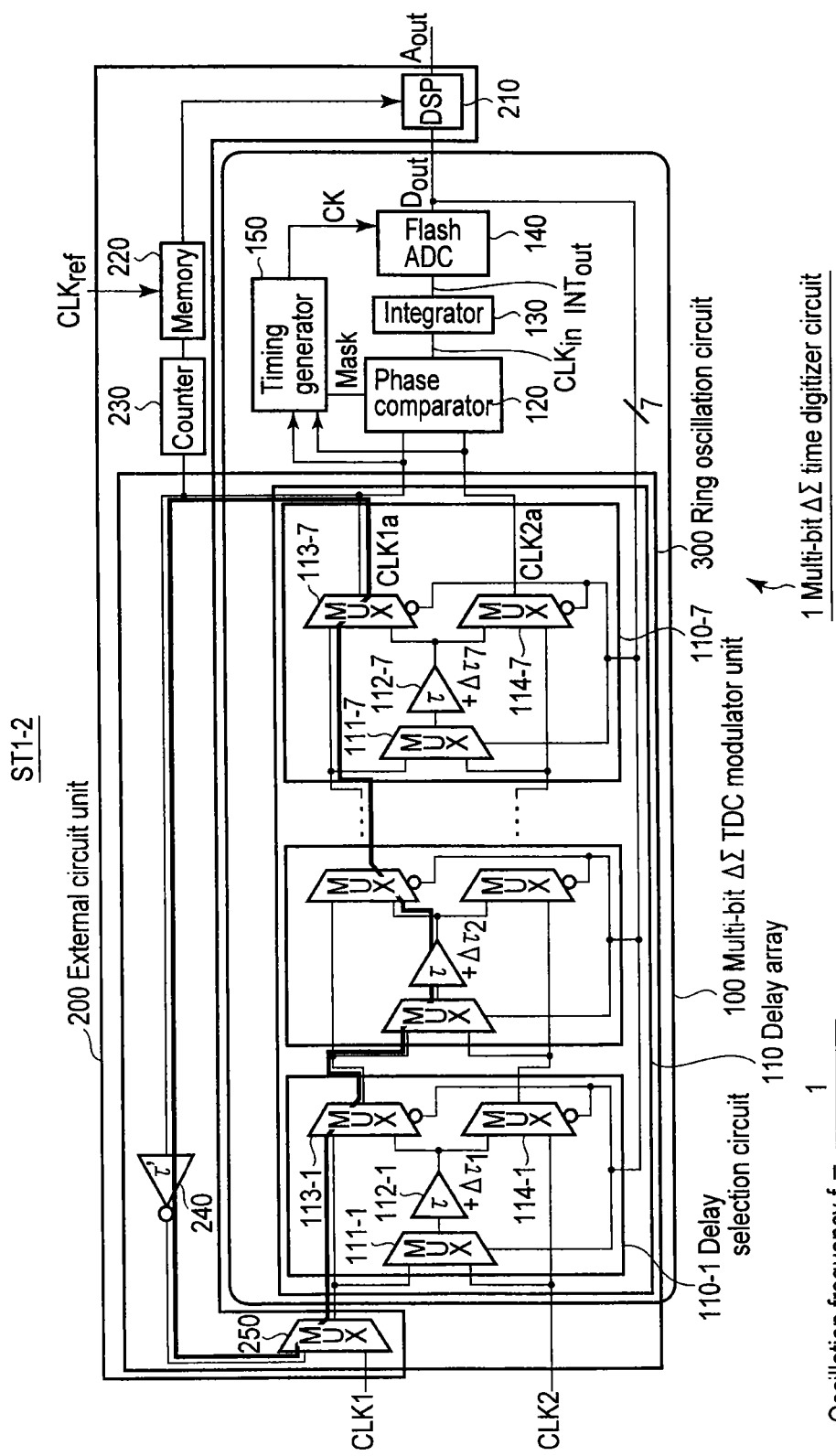
FIG. 6 is a block diagram for explaining the measurement operation of a delay value in step ST1-2 shown in FIG. 3 according to the first embodiment.

Next, as shown in FIG. 6, a second delay value delay value $\tau+\Delta\tau_2$ of the second delay element 112-2 is measured and calculated, and the result is stored in the memory 220 (step ST1-2 in FIG. 3). More specifically, as in step ST1-1, using equation (1), the second delay value $\tau+\Delta\tau_2$ of the delay element 112-2 is calculated from the oscillation frequency f of the clock signal $CLK_{osc}$, and the second delay value $\tau+\Delta\tau_2$ as the calculation result is stored in the memory 220.

After that, as in steps ST1-1 and ST1-2 in FIG. 3, using equation (1), delay values $\tau+\Delta\tau_3$ to $\tau+\Delta\tau_7$ are calculated from the oscillation frequency of the clock signal $CLK_{osc}$, and these calculation results are stored in the memory 220 (step ST1-3 to ST1-7 in FIG. 3).

As described above, in step ST1 in FIG. 2, the delay values $\tau+\Delta\tau_N$ of all the delay elements 112-*n* of the multi-bit ΔΣ time digitizer circuit 1 are respectively measured and calculated, and these results are stored in the memory 220.

[2-2-2] Step ST2

The method of measuring the rising timing interval between clocks in step ST2 in FIG. 2 will be described in detail below with reference to FIGS. 7 and 8.

Figure 7:
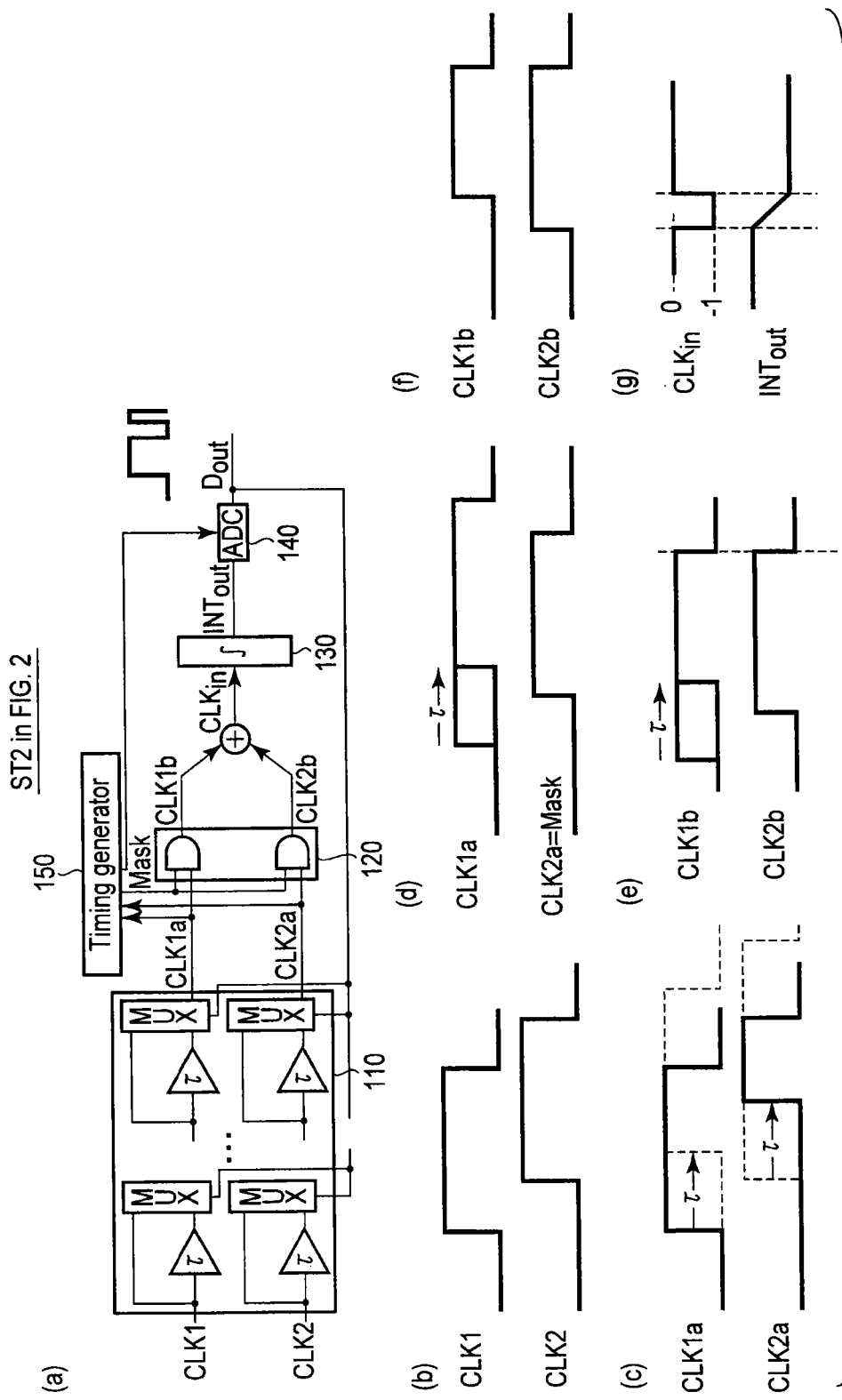
FIG. 7 includes views for explaining a method of measuring a rising timing interval between clocks in step ST2 shown in FIG. 2 according to the first embodiment.
Figure 8:
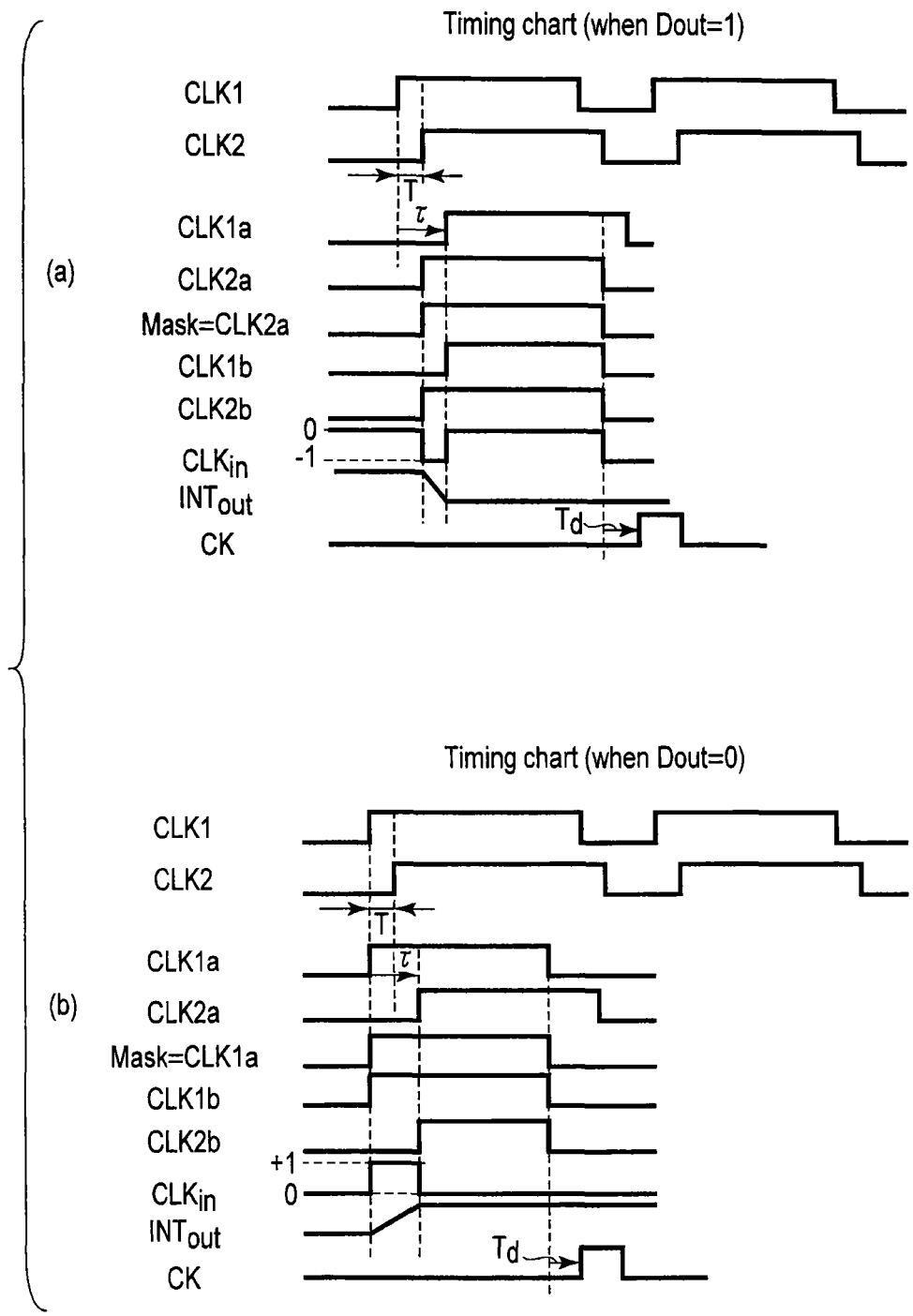
FIG. 8 includes timing charts showing measurement of the rising timing intervals between clocks in step ST2 shown in FIG. 2 according to the first embodiment.

Initially, the two clock signals CLK1 and CLK2 are input, and one of these signals is delayed by $\tau$ according to the output result $D_{out}$ of the flash ADC 140 (see (b) and (c) of FIG. 7). That is, a route of each of the two clock signals CLK1 and CLK2 is selected as that which passes through a signal without any processing or that which delays a signal via a delay route according to 0 or 1 as the output result $D_{out}$ of the flash ADC 140. A faster signal of the signals CLK1*a* and CLK2*a* output from the delay array 110 serves as a Mask signal. In this example, the clock signal CLK1*a* is delayed by $\tau$, and the clock signal CLK2*a* serves as a Mask signal (see (d) of FIG. 7). Then, the phase comparator 120 logically ANDs the Mask signal and the respective clock signals CLK1*a* and CLK2*a* to adjust falling timings (see (e) and (f) of FIG. 7). Subsequently, the time difference $CLK_{in}$ between the two signals CLK1*b* and CLK2*b* as the output results is calculated. The integrator 130 converts the time difference $CLK_{in}$ into a voltage, and integrates that voltage in the voltage mode, thus outputting the value $INT_{out}$ (see (g) of FIG. 7). This output result $INT_{out}$ is converted into a digital value using the flash ADC 140. As a result, outputs as many as bits are output as a thermometer code. According to the output result $D_{out}$ of this thermometer code, the routes for passing the respective signals CLK1 and CLK2 in response to the next clock are selected. For this reason, delay times of the respective signals are changed depending on the output result $D_{out}$ of the flash ADC 140. The rising timing interval between the clocks is calculated from the number of "1"s output form the flash ADC 140. Note that the clock CK required to operate the flash ADC 140 is generated using the timing generator 150 to be shifted by $T_d$ after the signals CLK1*b* and CLK2*b* fall.

In this case, when the clock signal CLK1 is faster, since the calculation result of the time difference between the clock signal assumes a positive value, the comparison result $D_{out}$ after integration is 1. In this case, a delay route is selected for the signal CLK1 and a through route is selected for the signal CLK2 in response to the next clock. The timing chart in this case is as shown in (a) of FIG. 8.

Conversely, when the clock signal CLK2 is faster, since the calculation result of the time difference between the clock signals assumes a negative value, the comparison result $D_{out}$ after integration is 0. In this case, a delay route is selected for the signal CLK2 in response to the next clock. The timing chart in such case is as shown in (b) of FIG. 8.

[2-2-3] Steps ST3 & ST4

Figure 9:
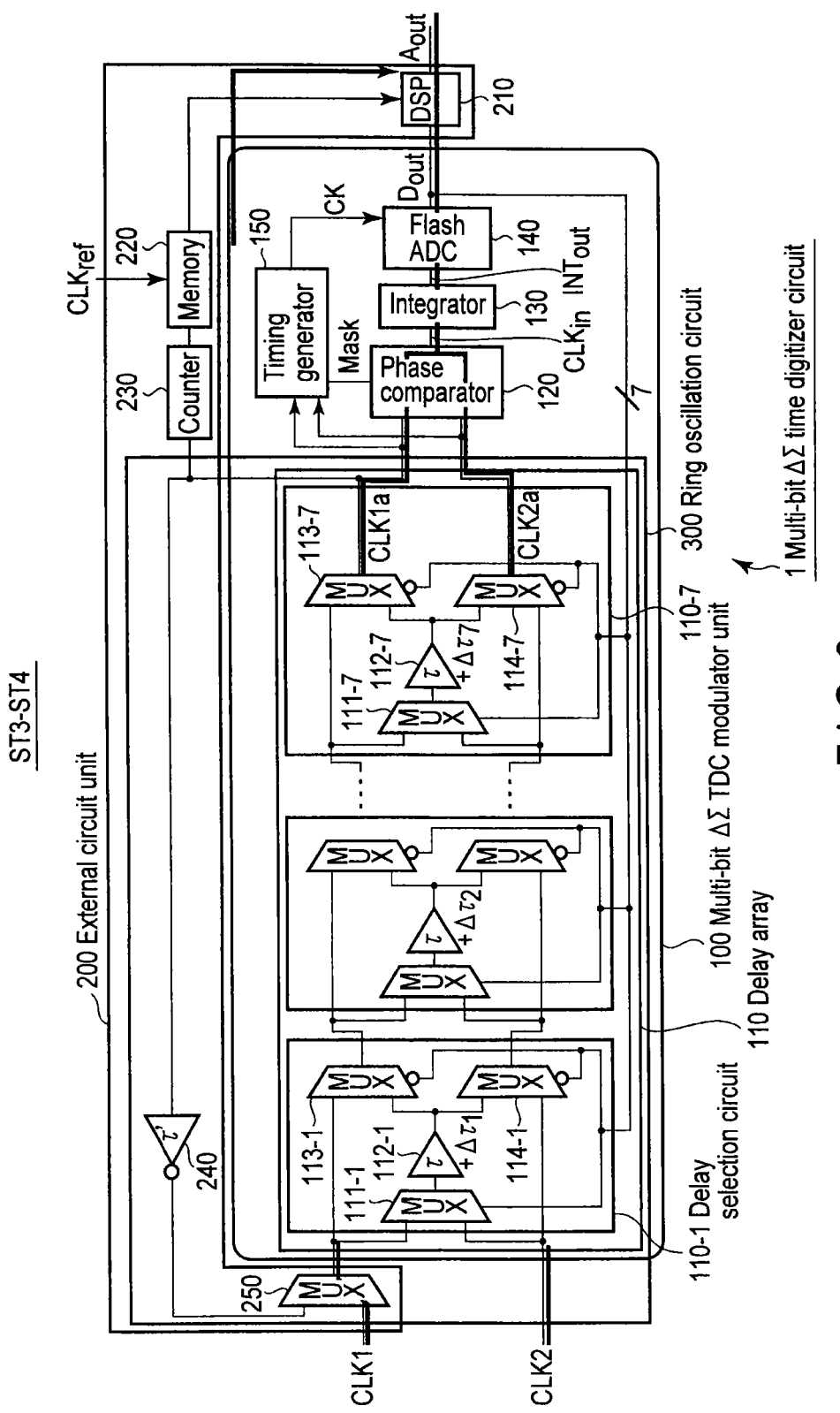
FIG. 9 is a block diagram for explaining a method of reading out and correcting delay data in steps ST3 and ST4 shown in FIG. 2 according to the first embodiment.

Steps ST3 and ST4 in FIG. 2 will be described in detail below with reference to FIGS. 9, 10, and 11. As shown in FIG. 9, delay data is read out from the memory 220 according to the measurement result $D_{out}$ of the rising timing interval between the signals CLK1 and CLK2 (step ST3 in FIG. 2), and the DSP 210 corrects an output signal (step ST4 in FIG. 2).

Figure 10:
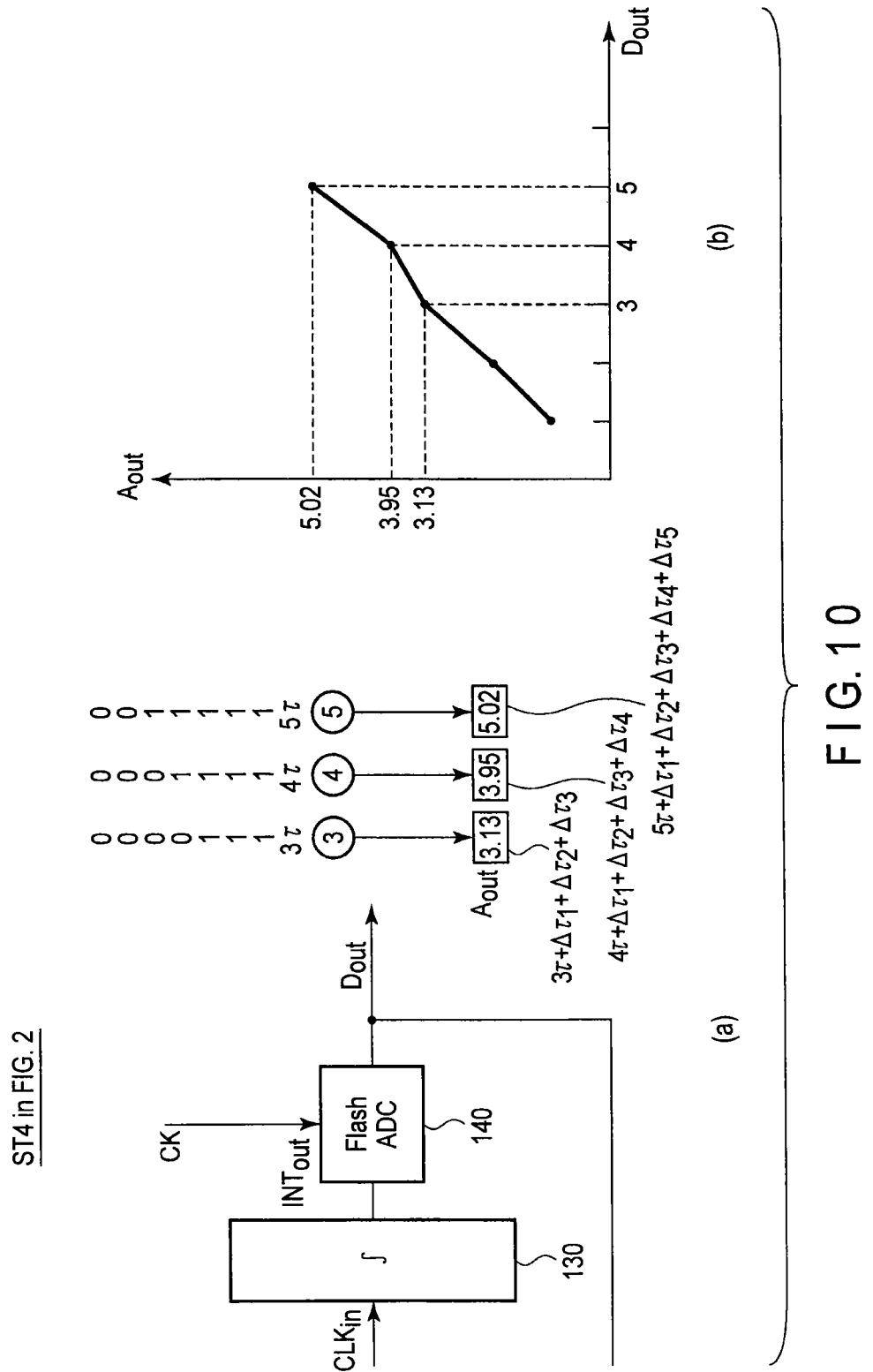
FIG. 10 includes views for explaining a correction method of an output signal in step ST4 shown in FIG. 2 according to the first embodiment.

As the output signal correction method, as shown in (a) and (b) of FIG. 10, measurement results $D_{out}$ (for example, 3, 4, and 5) are corrected to values $A_{out}$ (for example, 3.13, 3.95, and 5.02) including the delay errors $\Delta\tau_N$ read out from the memory 220.

Figures 11, 12:
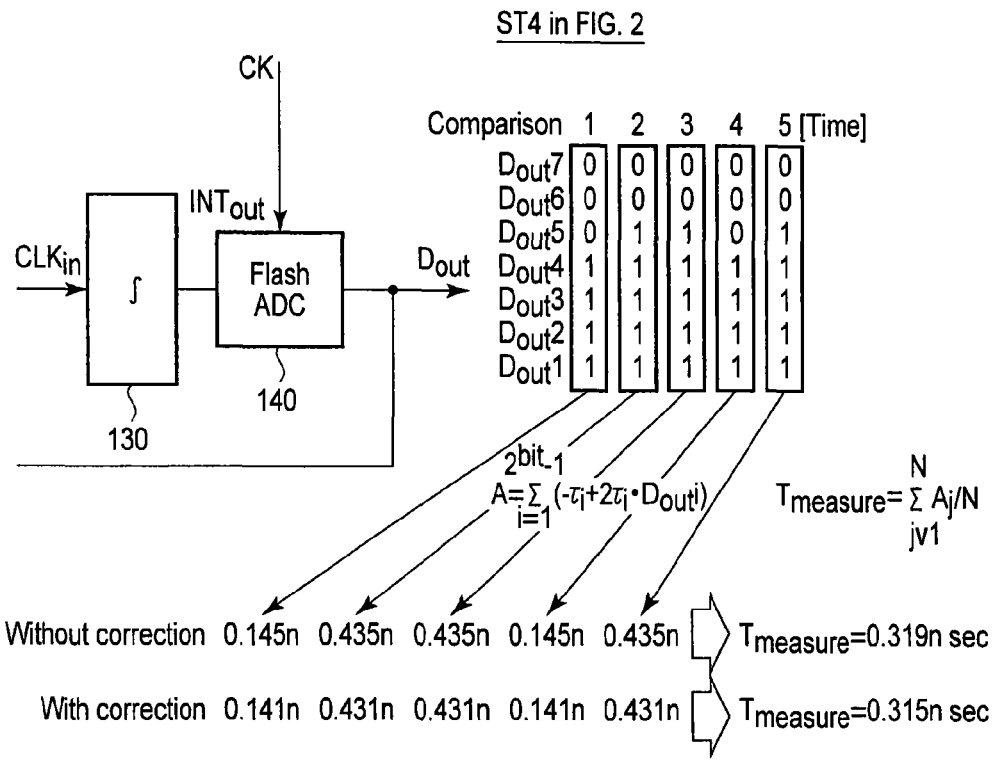
FIG. 11 is a view for explaining the correction method of an output signal in step ST4 shown in FIG. 2 in case of a 3-bit circuit according to the first embodiment.
FIG. 12 includes tables showing conditions 1 and 2 of delay parameters used in simulation of the multi-bit $\Delta\Sigma$ time digitizer circuit according to the first embodiment.

More specifically, assume that measurement results $D_{out}1$ to $D_{out}7$ of the rising timing intervals between the signals CLK1 and CLK2 of the first to fifth measurements are respectively "1111000", "1111100", "1111100", "1111000", and "1111100", as shown in FIG. 11.

In this case, in the conventional case without correction, values A are respectively 0.145 ns, 0.435 ns, 0.435 ns, 0.145 ns, and 0.435 ns, and a rising timing interval $T_{measure}$ is 0.319 ns.

On the other hand, in the case with correction according to the present invention, since delay errors are included, values A are respectively 0.141 ns, 0.431 ns, 0.431 ns, 0.141 ns, and 0.431 ns, and a rising timing interval $T_{measure}$ is 0.315 ns.

Note that the value A is given by:

$$A = \sum_{i=1}^{2^{bit}-1} (-\tau_i + 2\tau_i \cdot D_{out}i) \quad \text{equation (2)}$$

Also, the interval $T_{measure}$ is given by:

$$T_{measure} = \sum_{j=1}^{N} A_j / N \quad \text{equation (3)}$$

where N is the number of times of comparison.

[2-3] Effect

Operation recognition results of the multi-bit ΔΣ time digitizer circuit 1 according to this embodiment by a MATLAB® simulator will be described below with reference to FIGS. 12, 13, 14, 15, and 16.

Figure 13:
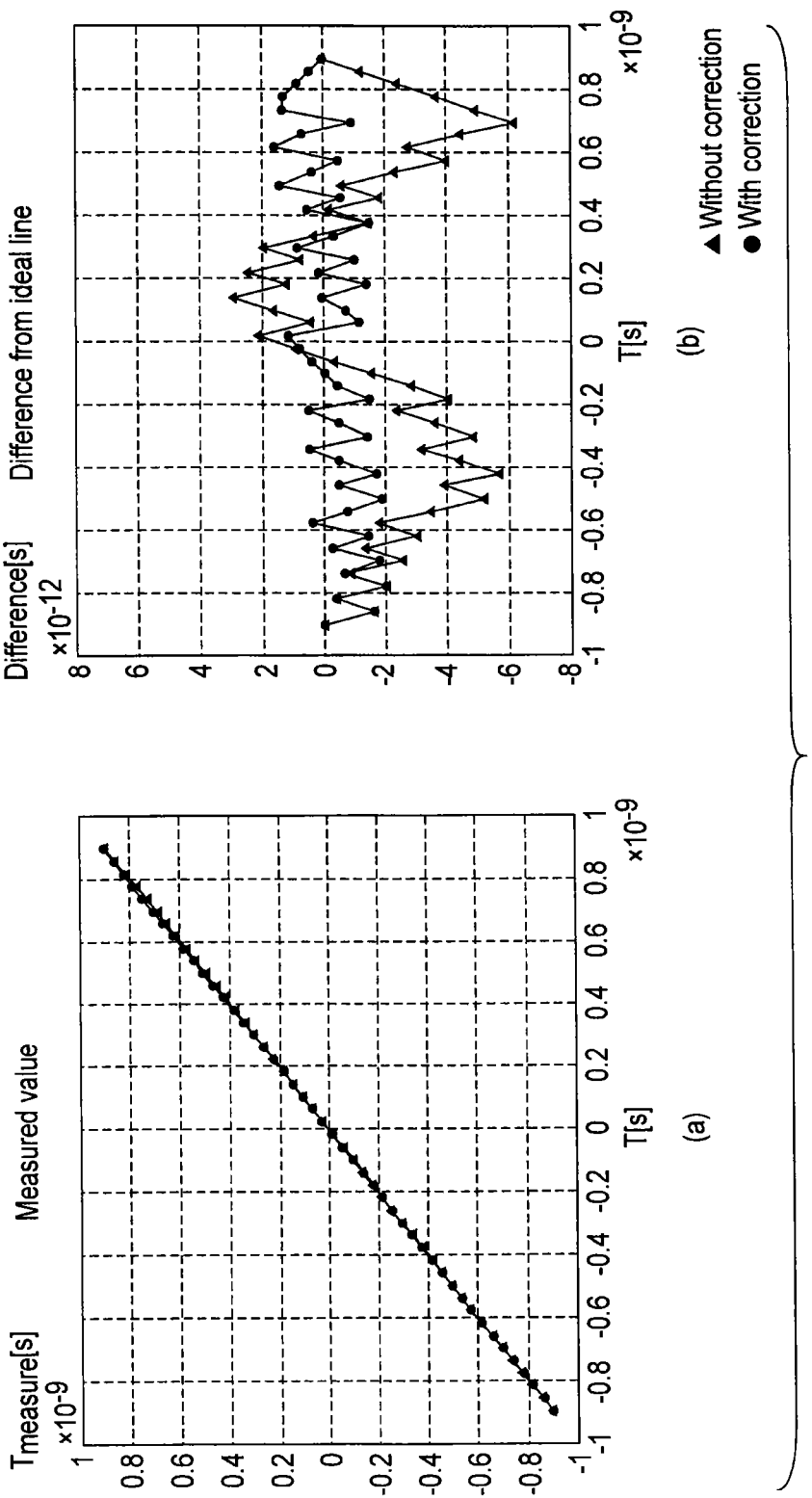
FIG. 13 includes graphs showing simulation results (condition 1, the number of outputs: 99 points) of the multi-bit $\Delta\Sigma$ time digitizer circuit according to the first embodiment.
Figure 15:
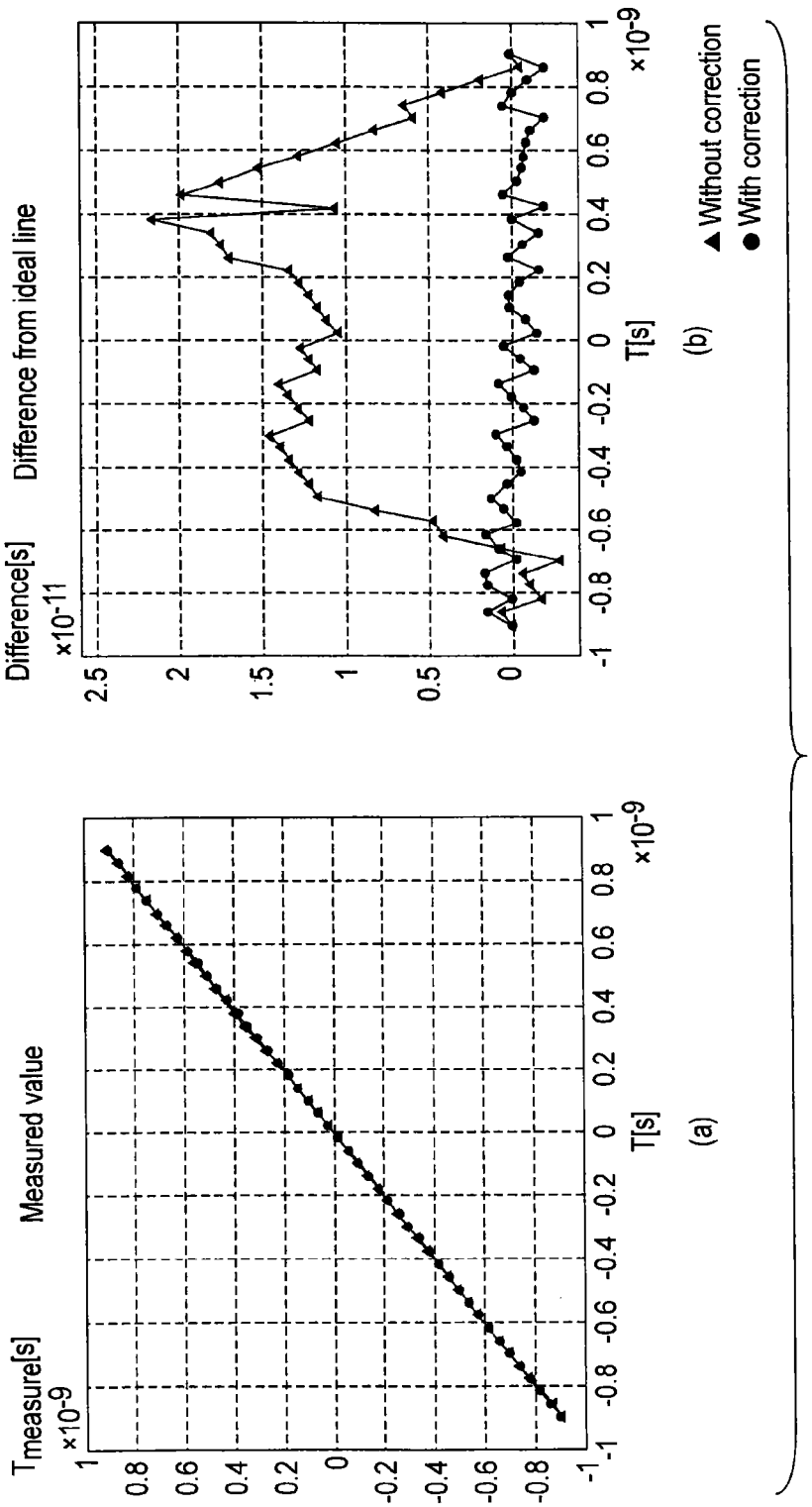
FIG. 15 includes graphs showing simulation results (condition 2, the number of outputs: 99 points) of the multi-bit $\Delta\Sigma$ time digitizer circuit according to the first embodiment.

Delay parameters generated for simulation include conditions 1 and 2, as shown in FIG. 12. In this case, delay variations were randomly generated using a Gaussian distribution, and were set to have an error of about ±10% of τ=0.145 ns in maximum. FIGS. 13 and 14 show a case of condition 1, and FIGS. 15 and 16 show a case of condition 2.

As a simulation condition, a 3-bit ΔΣ time digitizer circuit was used, a delay time τ of a delay cell was set to be τ=1 ns, and a rising timing interval T between the clock signals CLK1 and CLK2 was changed from T=−0.9 ns to T=0.9 ns in increments of 0.04 ns. Also, the number of outputs was 99 (points: 99 times of comparison) in FIGS. 13 and 15, and was 599 (points: 599 times of comparison) in FIGS. 14 and 16.

In FIGS. 13, 14, 15, and 16, graphs (a) show plots of intervals $T_{measure}$ with respect to rising timing intervals T between the clocks, and in FIGS. 13, 14, 15, and 16, graphs (b) show differences from ideal lines after simulation of the 3-bit ΔΣ time digitizer circuit under such conditions. Triangular plots indicate the case without correction (related art), and circular plots indicate the case with correction (this embodiment).

As can be seen from graphs (a) of FIGS. 13, 14, 15, and 16, the intervals $T_{measure}$ change according to the rising timing intervals T between the clocks, and their values change linearly. Also, as can be seen from graphs (b) of FIGS. 13, 14, 15, and 16, in the case with correction, a difference from the ideal line is smaller than the case without correction. Furthermore, when the number of outputs is larger, the difference becomes closer to the ideal line.

As described above, according to the first embodiment, before the time difference between the repetitive clocks is measured, actual delay values of the respective delay elements are self-measured, and an output result is then corrected based on the actual delay values at the measurement timing of the time difference between the repetitive clocks. In this manner, since the result is output in consideration of the delay values including errors, the linearity can be improved, and measurement errors due to delay errors can be suppressed.

Also, in case of error correction of the existing DAC, since a signal is "voltage" or "current", it is difficult to easily and accurately measure a mismatch between unit cells. However, in case of the present invention, since a signal is "time", a delay value can be easily and accurately measured.

[3] Second Embodiment

The second embodiment will exemplify a case in which a self-measurement time of delay values is shortened. Note that the second embodiment will mainly explain differences from the first embodiment.

[3-1] Circuit

Figure 17:
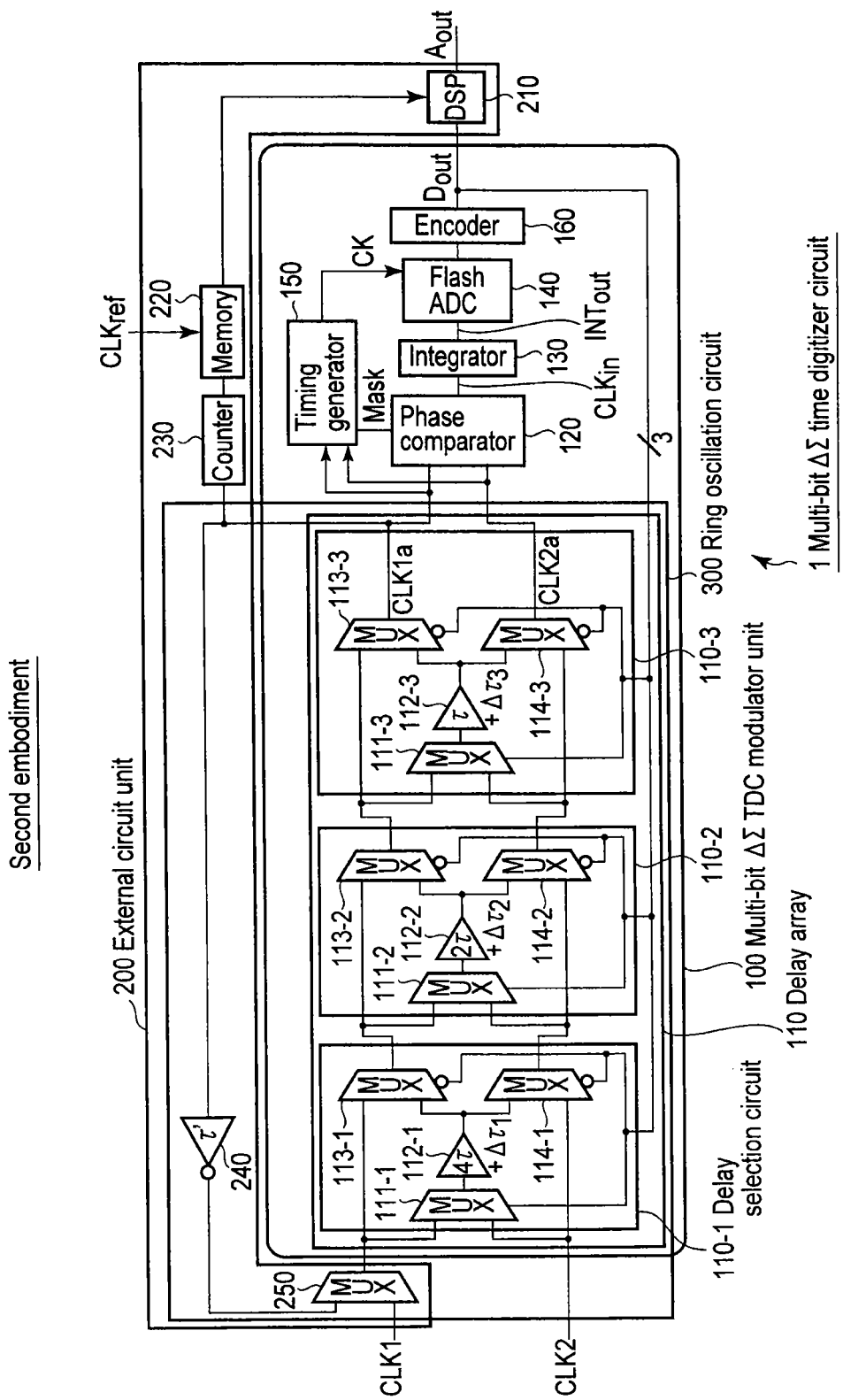
FIG. 17 is a block diagram showing the circuit arrangement of a multi-bit $\Delta\Sigma$ time digitizer circuit according to the second embodiment.

The circuit arrangement of a multi-bit ΔΣ time digitizer circuit according to the second embodiment will be described below with reference to FIG. 17. Note that this embodiment will exemplify a 3-bit circuit, but the number of bits can be variously changed.

In the first embodiment, all the delay values τ of the plurality of delay elements 112-$n$ are constant, and ($2^N-1$) delay elements 112-$n$ are required to configure an N-bit ΔΣ TDC.

By contrast, in the second embodiment, for example, in case of a 3-bit ΔΣ TDC, three delay elements 112-1 to 112-3 (delay selection circuits 110-1 to 110-3) are used, and they assume different delay values, that is, a delay value of the delay element 112-1 is 4τ, that of the delay element 112-2 is 2τ, and that of the delay element 112-3 is τ. Furthermore, in the second embodiment, an encoder 160 is added to the output of the flash ADC 140.

[3-2] Self-Calibration Method

Steps ST1 to ST4 in FIG. 2 will be described below with reference to FIGS. 18, 19, 20, 21, 22, and 23 taking a case of the three delay elements 112-1 to 112-3 according to this embodiment as an example. In the second embodiment, step ST1 in FIG. 2 is different from that in the first embodiment, and simply includes three delay value measurement steps.

Figure 18:
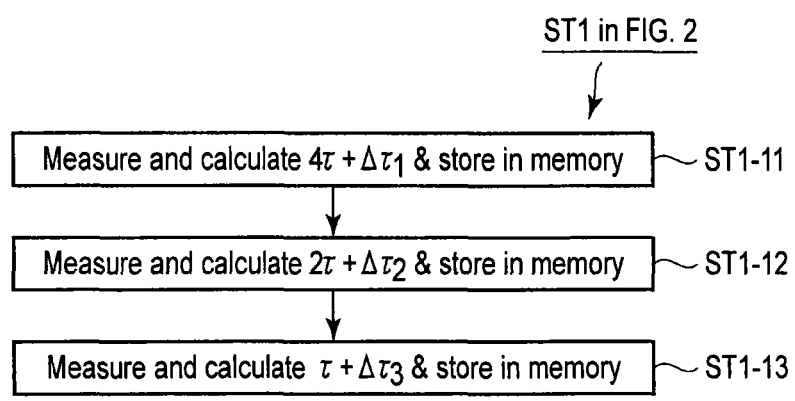
FIG. 18 is a flowchart showing a method of measuring and calculating delay values and storing the delay values in a memory in step ST1 shown in FIG. 2 according to the second embodiment.
Figure 20:
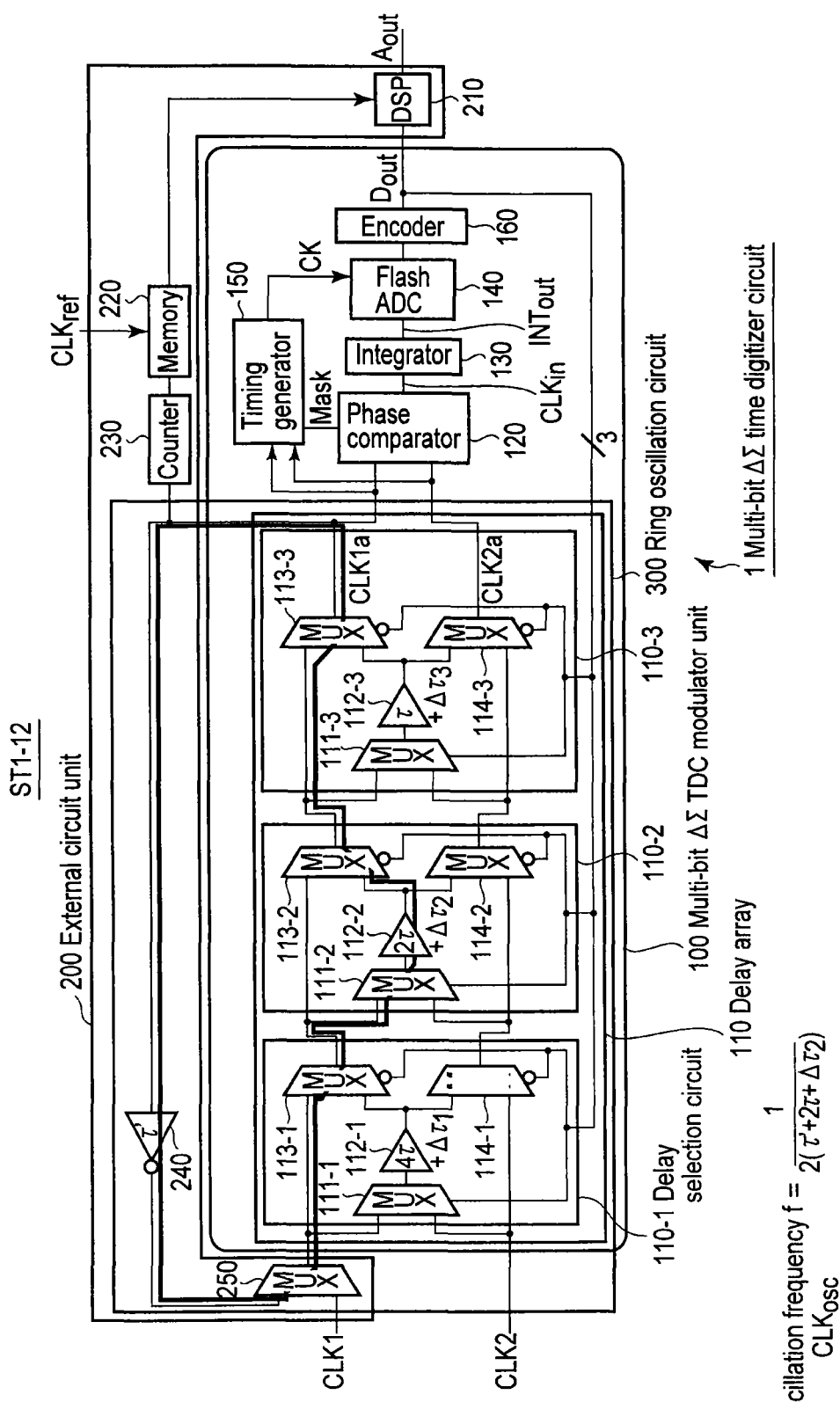
FIG. 20 is a block diagram for explaining a measurement operation of a delay value in step ST1-12 shown in FIG. 18 according to the second embodiment.
Figure 21:
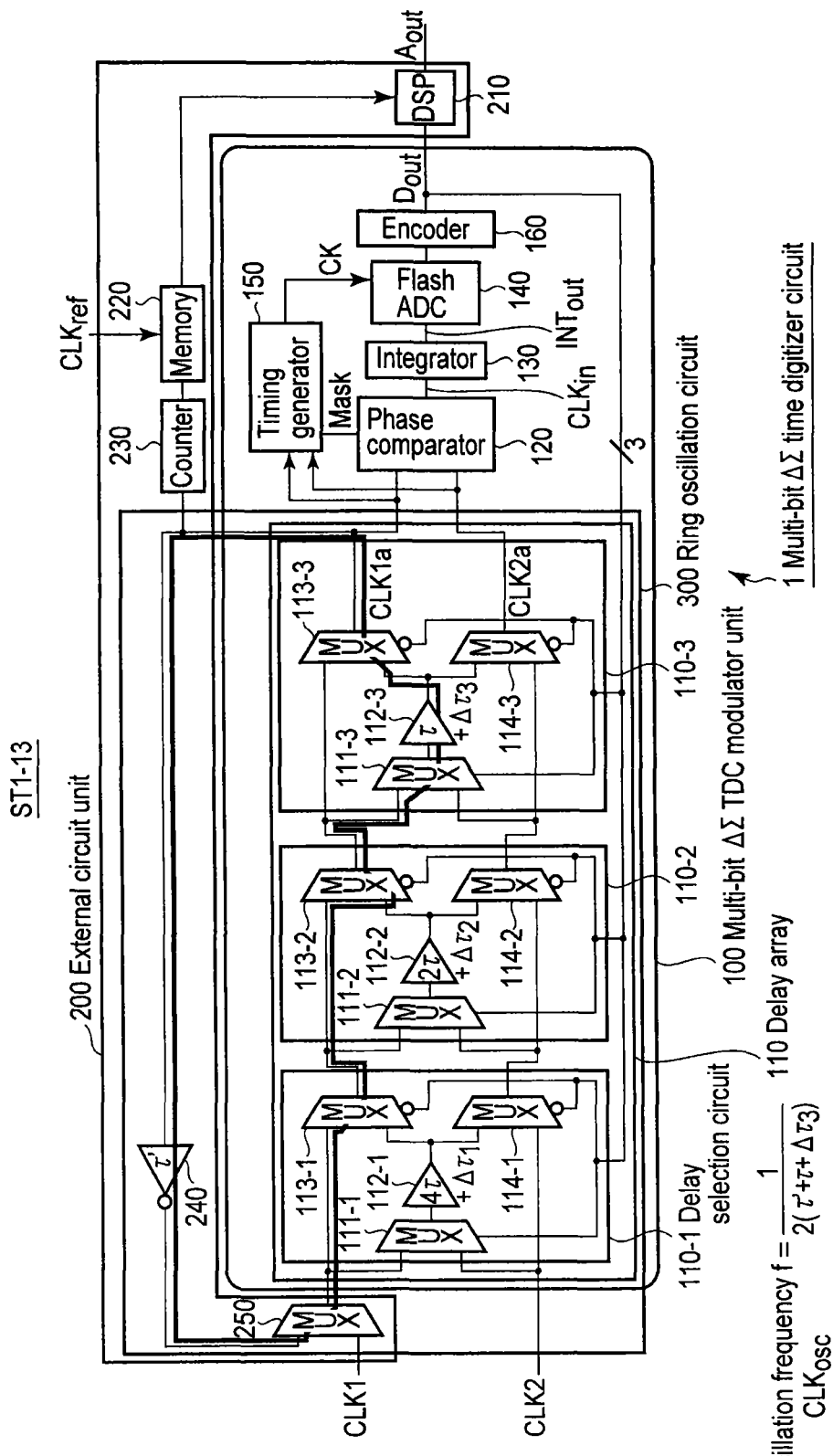
FIG. 21 is a block diagram for explaining a measurement operation of a delay value in step ST1-13 shown in FIG. 18 according to the second embodiment.

As shown in FIG. 19, a first delay value 4τ+Δτ$_1$ of the first delay element 112-1 is measured and calculated, and the result is stored in the memory 220 (step ST1-11 in FIG. 18). More specifically, using the ring oscillation circuit 300, the number of pulses of an oscillation clock signal CLK$_{osc}$, which passes through the first delay element 112-1 of the first delay selection circuit 110-1, is measured by the counter 230 to calculate an oscillation frequency f. Then, using equation (1), the first delay value 4τ+Δτ$_1$ of the first delay element 112-1 is calculated from the oscillation frequency f of the clock signal CLK$_{osc}$, and is stored in the memory 220. Next, as shown in FIG. 20, a second delay value 4τ+Δτ$_2$ of the second delay element 112-2 is measured and calculated, and the result is stored in the memory 220 (step ST1-12 in FIG. 18). Subsequently, as shown in FIG. 21, a third delay value τ+Δτ$_3$ of the third delay element 112-3 is measured and calculated, and the result is stored in the memory 220 (step ST1-13 in FIG. 18). After that, a rising timing interval between signals CLK1 and CLK2 is measured (step ST2 in FIG. 2).

Next, as shown in FIG. 22, delay data is read out from the memory 220 according to the measurement result $D_{out}$ of the rising timing interval between the signals CLK1 and CLK2 (step ST3 in FIG. 2), and the DSP 210 corrects an output signal (step ST4 in FIG. 2).

Figures 23, 24:
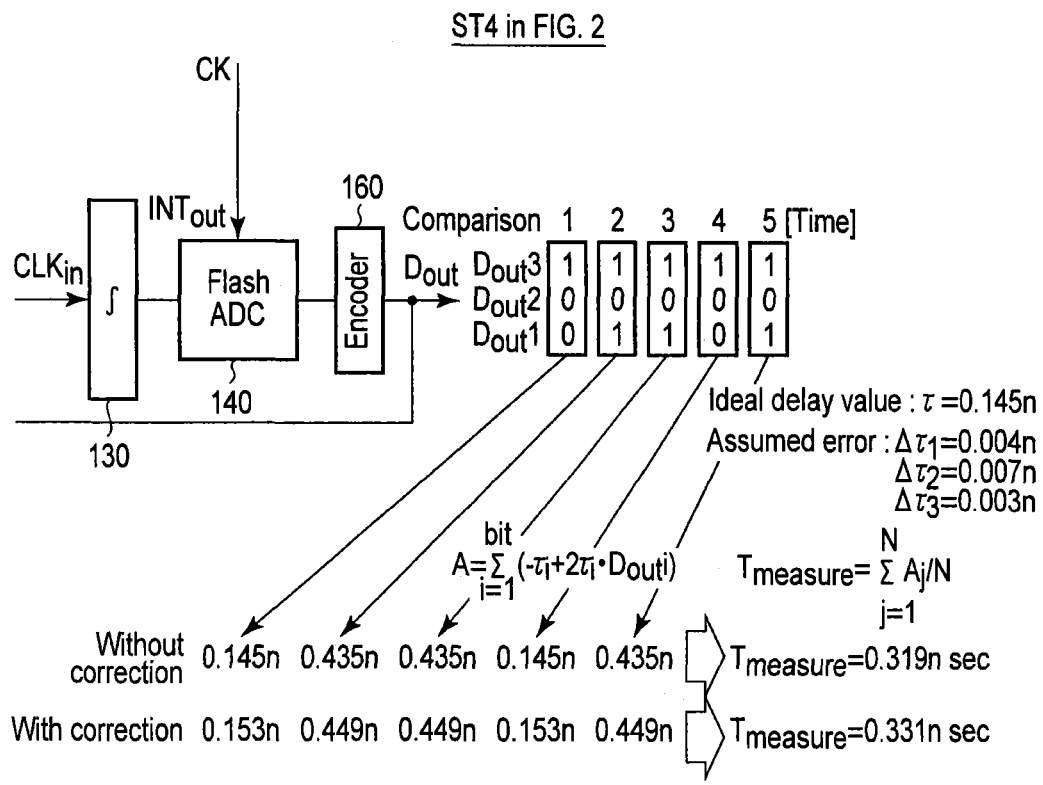
FIG. 23 is a view for explaining a correction method of an output signal in step ST4 shown in FIG. 2 according to the second embodiment.
FIG. 24 is a schematic block diagram showing the circuit arrangement in case of a secondary modulator in a multi-bit $\Delta\Sigma$ TDC modulator according to the third embodiment.

As the output signal correction method, assume that measurement results $D_{out}1$ to $D_{out}3$ of the rising timing intervals between the signals CLK1 and CLK2 of the first to fifth measurements are respectively "100", "101", "101", "100", and "101", an ideal delay value τ=0.145 ns, assumed errors $\Delta\tau_1$=0.0004 ns, $\Delta\tau_2$=−0.007 ns, and $\Delta\tau_3$=0.003 ns, as shown in FIG. 23.

In the conventional case without correction, values A are respectively 0.145 ns, 0.435 ns, 0.435 ns, 0.145 ns, and 0.435 ns, and a rising timing interval $T_{measure}$ is 0.319 ns.

On the other hand, in the case with correction according to the present invention, since the delay errors $\Delta\tau_1$, $\Delta\tau_2$, and $\Delta\tau_3$ are included, values A are respectively 0.153 ns, 0.449 ns, 0.449 ns, 0.153 ns, and 0.449 ns, and a rising timing interval $T_{measure}$ is 0.331 ns.

[3-3] Effect

According to the second embodiment, as in the first embodiment, since the result is output in consideration of the delay values including errors, the linearity can be improved, and measurement errors due to delay errors can be suppressed.

Furthermore, according to the second embodiment, since the number of delay elements is reduced, the self-measurement time of delay values can be shortened compared to the first embodiment.

[4] Third Embodiment

The first and second embodiments have exemplified the primary modulator having one integrator 130, while the third embodiment will exemplify an N-ary modulator having two or more integrators 130-N.

The schematic arrangement of a multi-bit ΔΣ TDC modulator unit 100 according to the third embodiment will be described below with reference to FIGS. 24 and 25. Note that in the third embodiment, details of the ΔΣ TDC modulator unit 100 and the external circuit unit 200 are the same as those in the first and second embodiments, and a description thereof will not be repeated.

FIG. 24 shows a case of a secondary modulator having two integrators 130-1 and 130-2. As shown in FIG. 24, in case of the secondary modulator, a conversion result of a time difference between delayed signals CLK1 and CLK2 into an analog voltage is an output of the integrator 130-1 of the first stage. After that, a digital output one clock before from the flash ADC 140 is converted into an analog output by a DAC 170, and that analog output is subtracted from the result of the first stage. This subtraction result is integrated by the integrator 130-2 of the second stage, and the output of the integrator 130-2 is converted using the flash ADC 140 to obtain a digital output $D_{out}$. Route control of the delay array 110 is executed according to this output result $D_{out}$.

Figure 25:
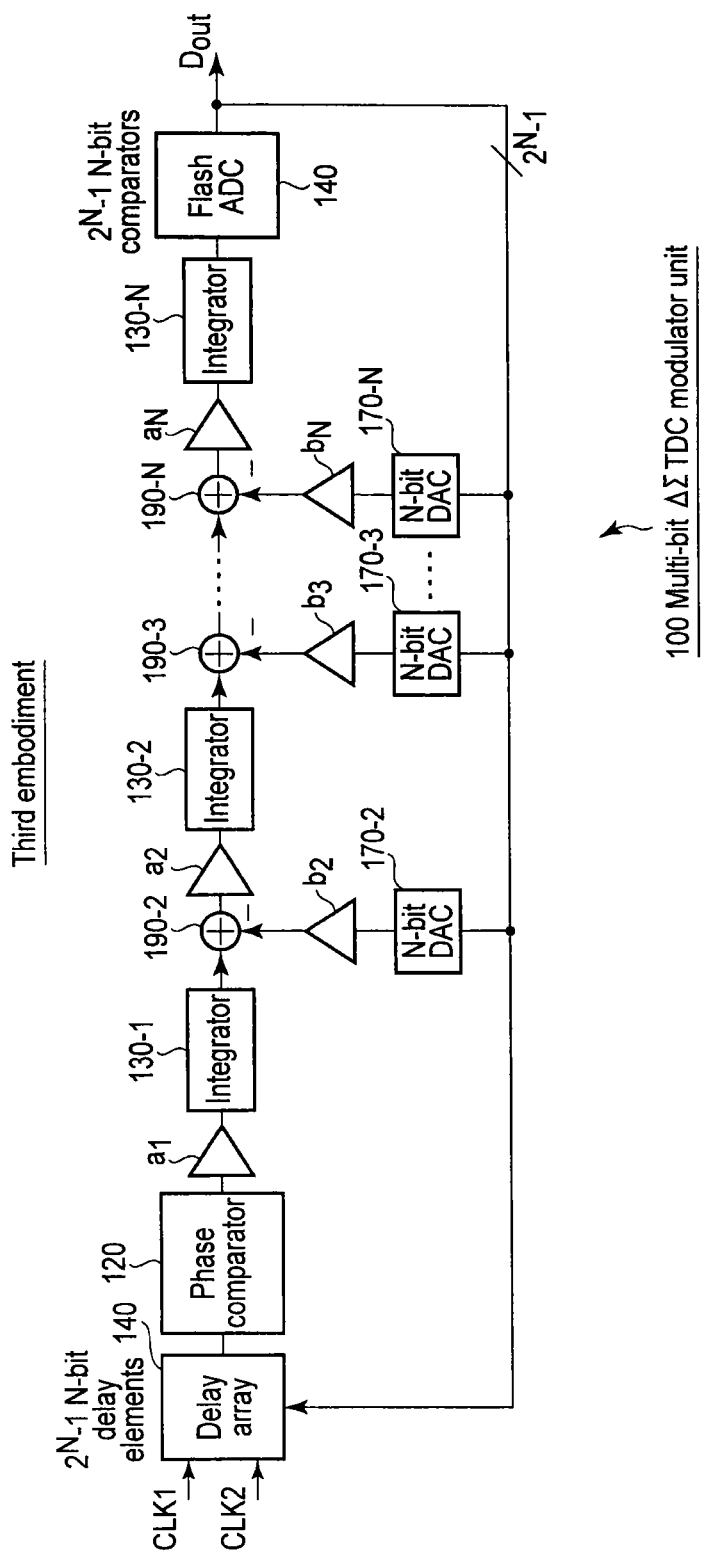
FIG. 25 is a schematic block diagram showing the circuit arrangement in case of an N-ary modulator in the multi-bit $\Delta\Sigma$ TDC modulator according to the third embodiment.

FIG. 25 shows an N-ary modulator having N integrators 130-N. As shown in FIG. 25, as for the circuit arrangement including the N integrators 130-N, the number of comparators of the flash ADC 140 is $2^N-1$, the number of delay elements is $2^N-1$, and the number of outputs $D_{out}$ is $2^N-1$.

Note that N≥2 in general, and the stability of the N-bit ΔΣ modulator does not pose any problem when it includes the N integrators.

As described above, according to the third embodiment, by applying the same arrangements as those of various conventional ternary or higher ΔΣ ADCs, a ternary or higher ΔΣ TDC arrangement using the arrangement of the present invention can be realized.

[5] Circuit Example of ΔΣ TDC

Circuit examples of a multi-bit ΔΣ TDC modulator unit 100 used in the respective embodiments will be described below. Note that the circuit of the ΔΣ TDC modulator unit 100 used in the respective embodiments is not limited to the following examples, and may be variously changed.

[5-1] Overall Circuit Arrangement

As shown in FIG. 26, the multi-bit ΔΣ TDC modulator unit 100 used in the respective embodiments includes a delay array 110 having a plurality of delay selection circuits 110-n, a phase comparator 120, a charge pump circuit 180 having integrators 130, and a flash ADC 140. The respective circuit components of such multi-bit ΔΣ TDC modulator unit 100 will be described in detail below.

[5-2] Delay Selection Circuit

The first and second examples of the delay selection circuit 110-n used in the respective embodiments will be described below with reference to (a) and (b) of FIG. 27.

Figures 27, 28:
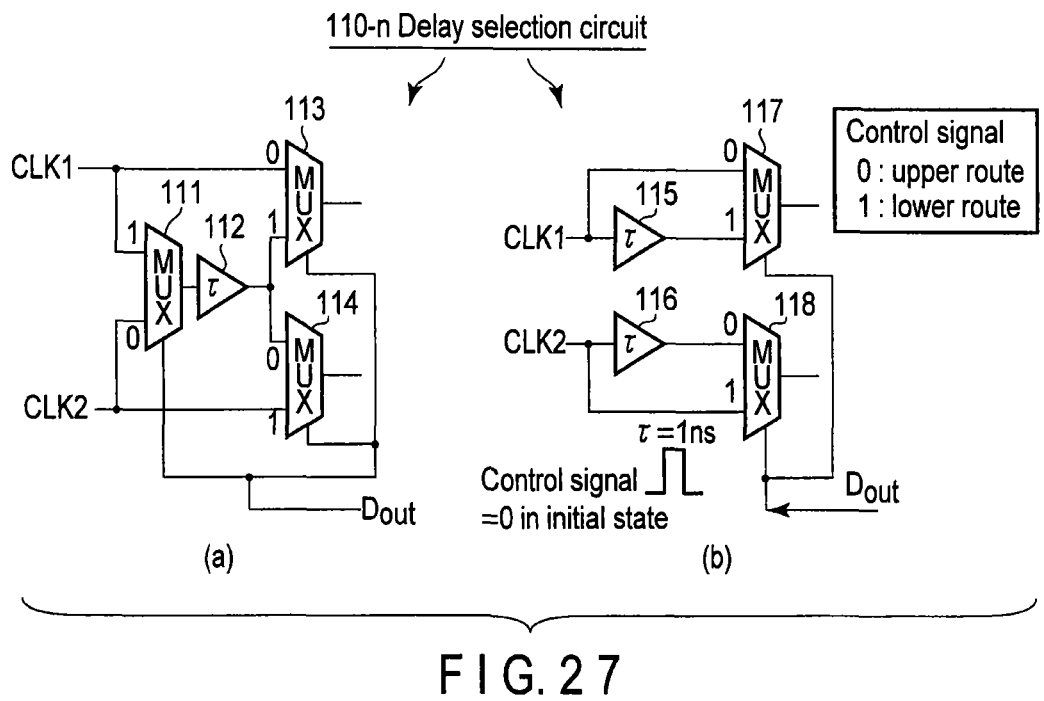
FIG. 27 includes circuit diagrams showing the arrangement of a delay selection circuit according to respective embodiments.
FIG. 28 includes circuit diagrams showing the arrangement of a delay element according to respective embodiments.

As shown in (a) of FIG. 27, the delay selection circuit 110 of the first example includes three multiplexers 111, 113, and 114, and one delay element 112.

Output signals of the multiplexers 111, 113, and 114 are controlled according to an output result $D_{out}$. That is, the multiplexer 111 inputs one of clock signals CLK1 and CLK2 to the delay element 112 according to the output result $D_{out}$. The multiplexer 113 outputs one of the clock signal CLK1 and the output signal of the delay element 112 according to the output result $D_{out}$. The multiplexer 114 outputs one of the clock signal CLK2 and the output signal of the delay element 112 according to the output result $D_{out}$.

When the output result $D_{out}$ is "0", for example, the multiplexer 111 inputs the clock signal CLK2 to the delay element 112, the multiplexer 113 outputs the clock signal CLK1 intact, and the multiplexer 114 outputs an output signal delayed by a delay value τ by the delay element 112. That is, when the output result $D_{out}$ is "0", the delay selection circuit 110 delays the clock signal CLK2.

On the other hand, when the output result $D_{out}$ is "1", for example, the multiplexer 111 inputs the clock signal CLK1 to the delay element 112, the multiplexer 113 outputs an output signal delayed by the delay value τ by the delay element 112, and the multiplexer 114 outputs the clock signal CLK2 intact. That is, when the output result $D_{out}$ is "1", the delay selection circuit 110 delays the clock signal CLK1.

As shown in (b) of FIG. 27, the delay selection circuit 110 of the second example includes two delay elements 115 and 116, and two multiplexers 117 and 118.

Output signals of the multiplexers 117 and 118 are controlled according to the output result $D_{out}$. For example, when the output result $D_{out}$ is "0", the multiplexer 117 outputs the clock signal CLK1 intact, and the multiplexer 118 delays the clock signal CLK2 by the delay value τ using the delay element 116 and outputs the delayed signal. On the other hand, when the output result $D_{out}$ is "1", for example, the multiplexer 117 delays the clock signal CLK1 by the delay value τ using the delay element 115 and outputs the delayed signal, and the multiplexer 118 outputs the clock signal CLK2 intact.

Examples of the delay element of the delay selection circuit 110 used in the respective embodiments will be described below with reference to (a) and (b) of FIG. 28.

As shown in (a) of FIG. 28, the delay element includes a plurality of (for example, 32) inverters INV. A delay value of the delay element is, for example, 1 ns.

As shown in (b) of FIG. 28, each inverter INV included in the delay element includes a PMOS transistor Tr1 and NMOS transistor Tr2. In the PMOS transistor Tr1, for example, a gate width Wp is 2.25 μm, and a gate length L is 180 nm. In the NMOS transistor Tr2, for example, a gate width Wn is 750 nm, and a gate length L is 180 nm. In this case, the gate width Wp of the PMOS transistor Tr1:the gate width Wn of the NMOS transistor Tr2 is, for example, 3:1.

[5-3] Phase Comparator

An example of the phase comparator 120 used in the respective embodiments will be described below with reference to (a) and (b) of FIG. 29 and (a) and (b) of FIG. 30. Note that in this case, a NAND phase comparator will be exemplified below.

As shown in (a) of FIG. 29, the phase comparator 120 includes D-flip-flops 121 and 122 and a NAND gate 123. The D-flip-flop 121 holds a value at a D input as a Q output ($V_{up}$) at a timing of a leading edge of a clock signal CLK1a input to a CK (CLOCK) input. The D-flip-flop 122 holds a value at a D input as a Q output ($V_{down}$) at a timing of a leading edge of a clock signal CLK2a input to a CK (CLOCK) input.

As shown in (b) of FIG. 29, in the phase comparator 120, the output $V_{up}$ rises (goes to 1) at the timing of the leading edge of the clock signal CLK1a, and the output $V_{down}$ rises (goes to 1) at the timing of the leading edge of the clock signal CLK2a. When both the outputs $V_{up}$ and $V_{down}$ of the phase comparator 120 rise (go to 1), a reset signal Reset goes to 0, and the outputs $V_{up}$ and $V_{down}$ also go to 0.

As shown in (a) and (b) of FIG. 30, the outputs $V_{up}$ and $V_{down}$ as the outputs Q of the D-flip-flops 121 and 122 are respectively decided by the timings of the leading edges of the clock signals CLK1a and CLK2a. In FIG. 30, (a) shows a case in which the leading edge of the signal CLK1a is earlier than that of the signal CLK2a, and in FIG. 30, (b) shows a case in which the leading edge of the signal CLK2a is earlier than that of the signal CLK1a.

[5-4] Charge Pump Circuit

Examples of the charge pump circuit 180 used in the respective embodiments will be described below with reference to (a) and (b) of FIG. 31 and FIG. 32.

In a charge pump circuit 180a of a basic type shown in (a) of FIG. 31, an output $V_{out}$ may influence a current value of a current source. By contrast, in a charge pump circuit 180b of an operational amplifier type shown in (b) of FIG. 31, a current value keeps a constant value without being influenced by the output $V_{out}$, and integration can be accurately attained.

As shown in (b) of FIG. 31, the charge pump circuit 180b of the operational amplifier type includes an operational amplifier OP, switches SW1, SW2, and SW3, a resistor R, and capacitor C. The switches SW1, SW2, and SW3 are configured by PMOS transistors, NMOS transistors, and the like.

In the charge pump circuit 180b of the operational amplifier type, when the switch SW1 to which the output $V_{up}$ of the phase comparator 120 is input is turned on, the capacitor C is charged. On the other hand, when NMOS switch SW2 to which the output $V_{down}$ of the phase comparator 120 is input is turned on, the capacitor C is discharged. In this way, the switches SW1 and SW2 are controlled by the input voltages $V_{up}$ and $V_{down}$.

Figure 32:
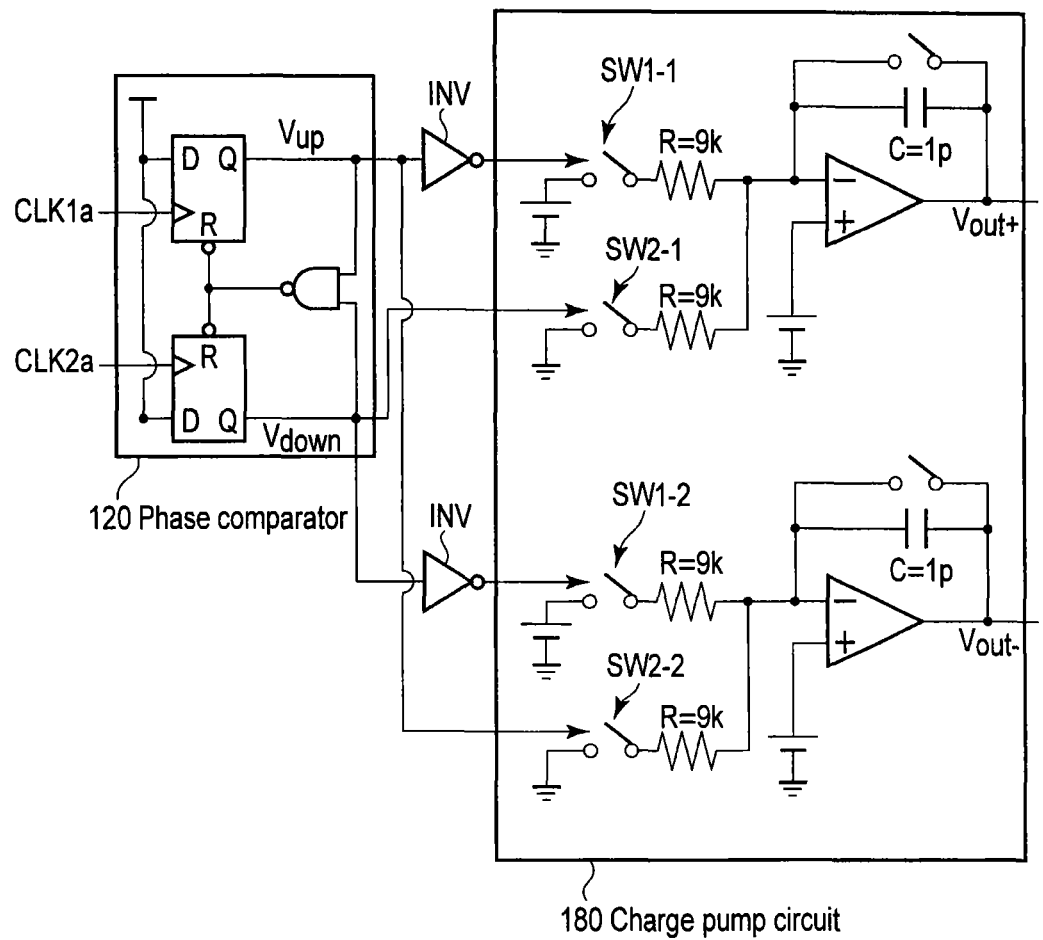
FIG. 32 is a circuit diagram showing the connection relationship between the phase comparator and charge pump circuit according to respective embodiments.

As shown in FIG. 32, the phase comparator 120 and charge pump circuit 180 are connected by adding inverters INV. That is, a switch SW1-1 is controlled by an inverted signal of the output $V_{up}$, a switch SW2-1 is controlled by the output $V_{down}$, a switch SW1-2 is controlled by an inverted signal of the output $V_{down}$, and a switch SW2-2 is controlled by the output $V_{up}$.

[5-5] Flash ADC

Figure 33:
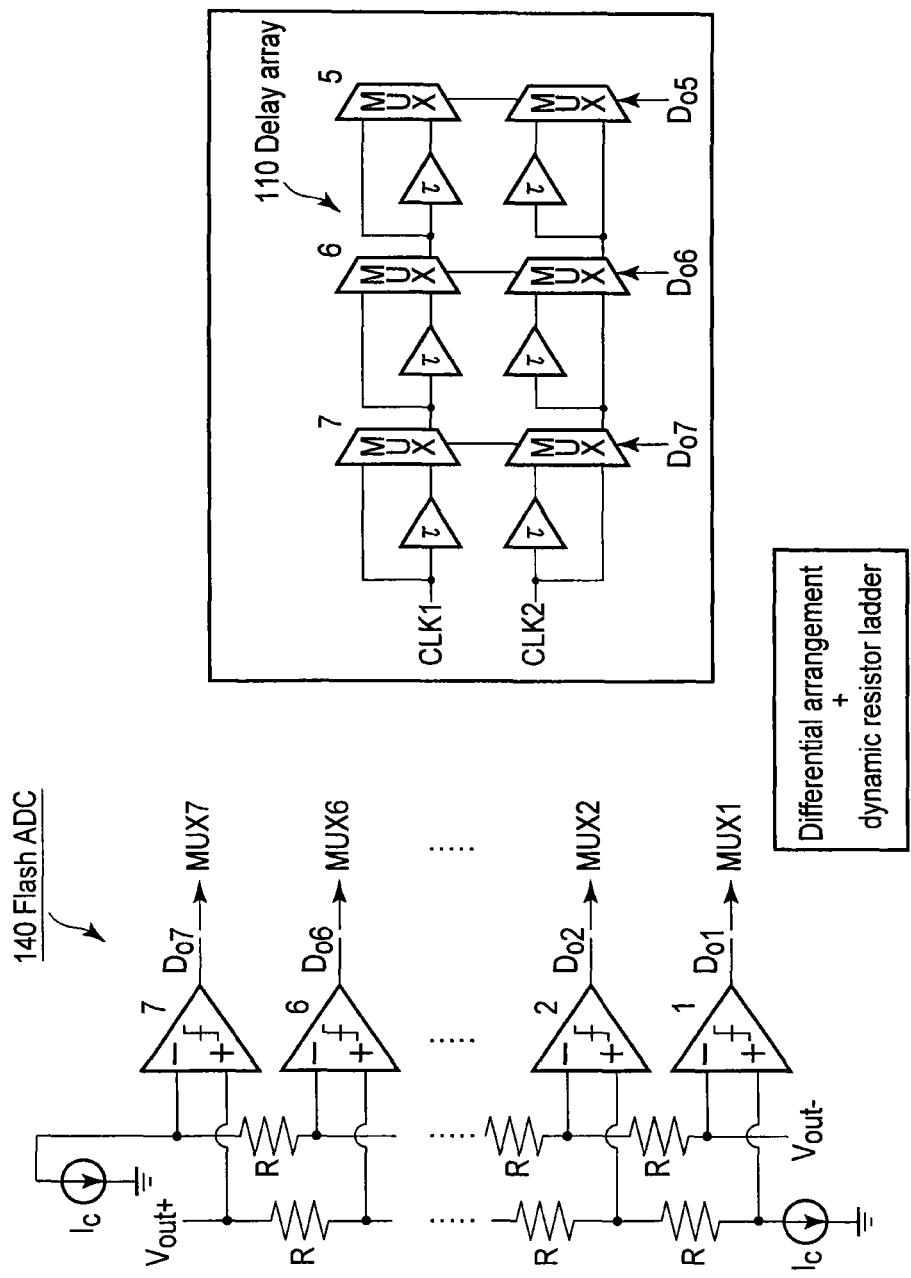
FIG. 33 is a circuit diagram showing the arrangement of a flash A/D converter according to respective embodiments.
Figure 34:
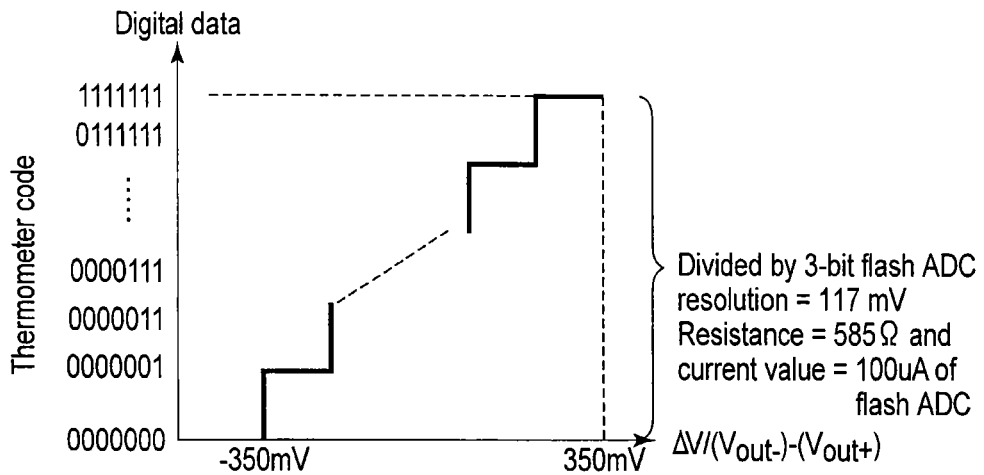
FIG. 34 is a graph for explaining the output of the flash A/D converter according to respective embodiments.

An example of the flash ADC 140 used in the respective embodiments will be described below with reference to FIGS. 33 and 34. Note that a 3-bit circuit will be exemplified below.

The flash ADC 140 includes a combination of a differential arrangement and dynamic resistor ladder. The flash ADC 140 outputs a digital value according to a difference (ΔV) between the outputs $V_{out}+$ and $V_{out}-$ of the charge pump circuit 180. For example, when the difference ΔV is −350 mV or lower, the flash ADC 140 outputs "0000000", and when the difference ΔV is 350 mV or higher, it outputs "1111111".

[6] Improvement Example of Ring Oscillation Circuit

A frequency $f_{osc}$ of the aforementioned ring oscillation circuit is a function of the delay value τ. This delay value τ is an average value of $τ_r$ and $τ_f$ and is expressed by:

$$τ=(τ_r+τ_f)/2$$

where $τ_r$ is a delay value when a buffer output rises from low level to high level. $τ_f$ is a delay value when the buffer output falls from high level to low level. When rising timings of two signals are to be measured, only the rising delay value $τ_r$ of the buffer is required.

However, when $τ_r$ and $τ_f$ are different, the aforementioned ring oscillation circuit often may not accurately measure $τ_r$.

Figure 35:
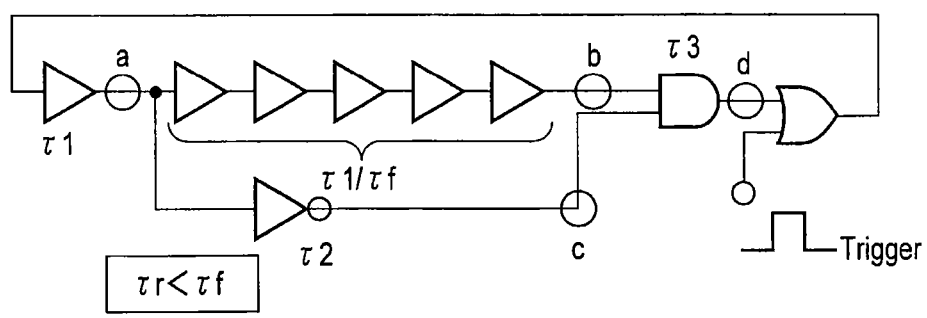
FIG. 35 is a circuit diagram for explaining the improvement example of ring oscillation circuit according to respective embodiments.

Hence, in this case, the principle of allowing to accurately measure $τ_r$ will be described below with reference to the circuit diagram shown in FIG. 35 and the timing chart shown in FIG. 36. Note that $τ_r<τ_f$ in this case.

Figure 36:
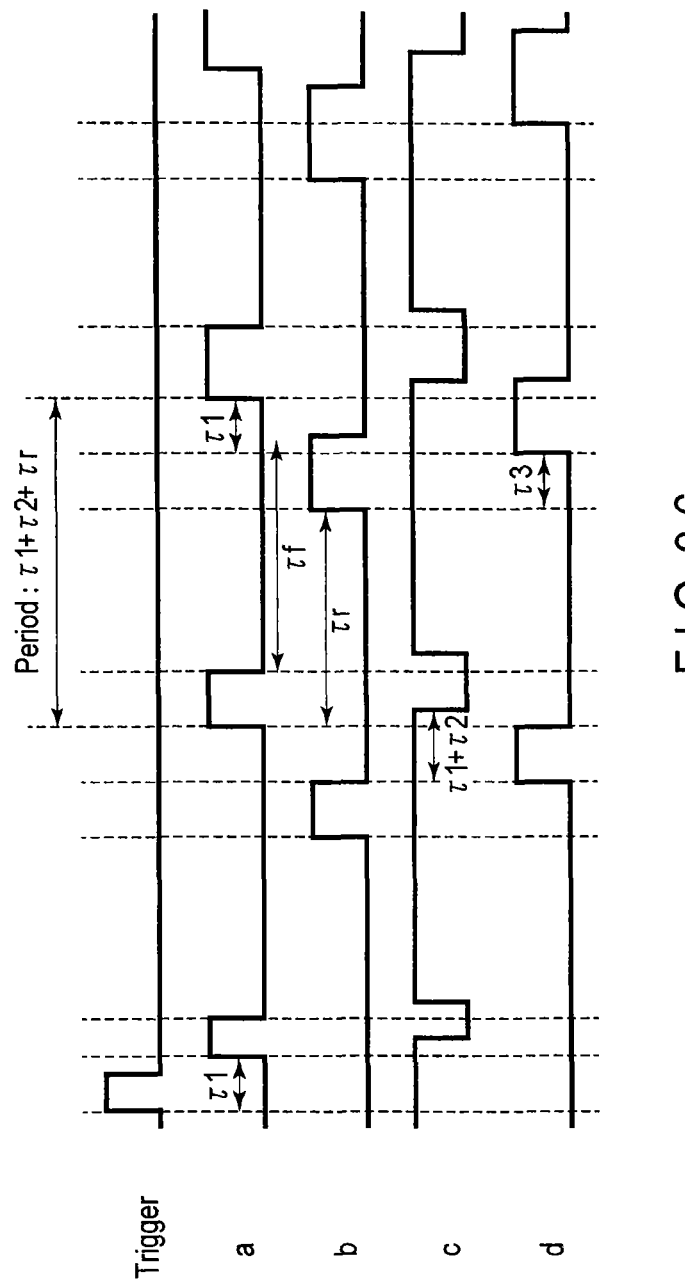
FIG. 36 is a timing chart for explaining the improvement example of ring oscillation circuit according to respective embodiments.

As shown in the timing chart of FIG. 36, a clock pulse cycle of node a is defined by $τ_1+τ_r+τ_3$, and does not include $τ_f$. Since $τ_1$ and $τ_3$ are common in a buffer delay measurement circuit ($τ_r$ is different for each buffer), they can be canceled by calculations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multi-bit delta-sigma time digitizer circuit, which measures a rising timing interval between a first clock signal and a second clock signal, the circuit comprising:

a delay array which includes a plurality of delay selection circuits respectively including a delay element and a multiplexer, and is configured to delay one of the first clock signal and the second clock signal;

a phase comparator configured to calculate a time difference according to an output signal of the delay array;

an integrator configured to integrate the time difference output from the phase comparator;

a flash A/D converter configured to execute digital conversion according to an integration result of the integrator;

a ring oscillation circuit configured to include the delay array;

a counter configured to measure a number of pulses of a clock signal which passes through the ring oscillation circuit;

a memory configured to store a delay value of the delay element calculated from an oscillation frequency based on the number of pulses; and a processor configured to correct an output result of the A/D converter based on the delay value stored in the memory when the rising timing interval between the first clock signal and the second clock signal input to the delay array is measured.

2. The circuit according to claim 1, wherein the ring oscillation circuit comprises:

an inverter connected to an output of the delay array; and a selector connected to an output of the inverter and an input of the delay array.

3. A calibration method for a multi-bit delta-sigma time digitizer circuit, which measures a rising timing interval between a first clock signal and a second clock signal, the method comprising:

respectively measuring delay values of a plurality of delay elements before the rising timing interval is measured; and correcting a measurement result of the rising timing interval based on the measured delay values when the rising timing interval is measured.

4. The method according to claim 3, wherein the measuring the delay values is executed using a ring oscillation circuit configured to include a delay array including the plurality of delay elements.

5. The method according to claim 4, wherein in the measuring the delay values, a number of pulses of a clock signal which passes through the ring oscillation circuit is measured, and the delay values of the delay elements are calculated from an oscillation frequency based on the number of pulses.

* * * * *